(12) United States Patent
Lie

(10) Patent No.: US 6,671,868 B1
(45) Date of Patent: Dec. 30, 2003

(54) METHOD OF CREATING MCM PINOUTS

(75) Inventor: James H. Lie, Santa Clara, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 10/005,823

(22) Filed: Dec. 3, 2001

(51) Int. Cl.$^7$ .............................................. G06F 17/50
(52) U.S. Cl. .......................... 716/16; 716/15; 716/13; 716/14
(58) Field of Search ............................. 716/15, 16, 13, 716/14

(56) References Cited

U.S. PATENT DOCUMENTS

| | | | | |
|---|---|---|---|---|
| 5,625,563 A | * | 4/1997 | Rostoker et al. | 716/2 |
| 5,635,424 A | * | 6/1997 | Rostoker et al. | 438/612 |
| 6,226,560 B1 | * | 5/2001 | Hama et al. | 700/97 |
| 6,396,707 B1 | * | 5/2002 | Huang et al. | 361/760 |
| 6,499,134 B1 | * | 12/2002 | Buffet et al. | 716/12 |
| 6,510,539 B1 | * | 1/2003 | Deemie et al. | 716/2 |
| 6,539,531 B2 | * | 3/2003 | Miller et al. | 716/15 |
| 6,574,780 B2 | * | 6/2003 | Le Coz | 716/4 |
| 6,589,801 B1 | * | 7/2003 | Yoon et al. | 438/15 |
| 2001/0039644 A1 | * | 11/2001 | Le Coz | 716/11 |
| 2002/0073384 A1 | * | 6/2002 | Buffet et al. | 716/4 |
| 2003/0009738 A1 | * | 1/2003 | Wadland et al. | 716/13 |
| 2003/0126578 A1 | * | 7/2003 | Wadland et al. | 716/12 |

OTHER PUBLICATIONS

Su et al., "Solder joint reliability modeling for a 540–I/O plastic ball–grid–array assembly", Proceedings of 1998 7th International Conference on Multichip Modules and High Density Packaging, Apr. 15, 1998, pp. 422–428.*

Tower et al., "Prediction of yield of flip–chip solder assemblies", Proceedings for 1998 $7^{th}$ International Conference on Multichip Modules and High Density Packaging, Apr. 15, 1998, pp. 35–40.*

Mercado et al., "Reliability of multi–layer aluminum capped copper interconnect structures", Twenty–Sixth IEEE/CPMT International Electronics Manufacturing Technology Symposium, Oct. 2, 2000, pp. 84–93.*

Hama et al., "Curvilinear detailed routing with simultaneous wire–spreading and wire–fattening", IEEE Transactions on Computer–Aided Design of Integrated Circuits and Systems, vol. 18, No. 11, Nov. 1999, pp. 1646–1653.*

* cited by examiner

Primary Examiner—Matthew Smith
Assistant Examiner—Phallaka Kik
(74) Attorney, Agent, or Firm—Christopher P. Maiorana, P.C.

(57) ABSTRACT

A method for creating pinouts for inter-die connections comprising the steps of filling a number of columns of a computer readable file with information about pads and balls of the inter-die connections, marking portions of the computer readable file indicating a correlation between the pads and the balls, and generating a netlist according to one or more sets of computer executable instructions in the computer readable file.

21 Claims, 23 Drawing Sheets

222 GENERATE A LIST OF BALLS

224 BORDER A SET OF CELLS TO DRAW A GRID REPRESENTATION

226 COMPARE BALL LIST AND GRID TO CHECK FOR ERRORS

228 CHECK FOR ROTATIONAL SHORTS

[BANK]
| | | |
|---|---|---|
| 0 | 3.3 | N/A |
| 1 | 3.3 | N/A |
| 7 | 3.3 | N/A |

[DIE]
| | |
|---|---|
| u0 | PACKAGE |
| u1 | DELTA39K |
| u3 | PSI6GSERDES |

[PAD]
| | | | |
|---|---|---|---|
| u0.A1 | GND GND | | |
| u1.3 | GCTL | GCTL0 | 0 |
| u0.N23 | GCTL | GCTL0 | |
| u0.A25 | GND GND | | |
| u1.7 | GCLK | GCLK0 | 0 |
| u0.M23 | GCLK | GCLK0 | |
| u0.A26 | GND GND | | |
| u1.11 | IO IO0 | 0 | LA0 |
| u3.67 | TXPERD | | LVTTL_24mA, BUSHOLD |
| u1.13 | IO IO1 | 0 | LA1 |
| u3.89 | RXDD_7 | | LVTTL_24mA, BUSHOLD |
| u1.15 | IO IO2 | 0 | LA2 |
| u3.90 | RXDD_6 | | LVTTL_24mA, BUSHOLD |
| u1.17 | IO IO3 | 0 | LA3 |
| u3.96 | RXDD_5 | | LVTTL_24mA, BUSHOLD |
| u1.19 | IO IO4 | 0 | LA4 |
| u3.97 | RXDD_4 | | LVTTL_24mA, BUSHOLD |
| u1.21 | IO IO5 | 0 | LA5 |
| u3.98 | RXDD_3 | | LVTTL_24mA, BUSHOLD |
| u1.25 | IO IO6 | 0 | LA6 |
| u3.99 | RXDD_2 | | LVTTL_24mA, BUSHOLD |
| u1.27 | IO IO7 | 0 | LA7 |
| u3.102 | RXDD_1 | | LVTTL_24mA, BUSHOLD |

FIG. 23a

| | | |
|---|---|---|
| u0.B21 | SERDES | INC2+ |
| u3.308 | INC2+ | NA |
| u0.A23 | SERDES | OUTC1- |
| u3.313 | OUTC1- | NA |
| u0.B23 | SERDES | OUTC1+ |
| u3.314 | OUTC1+ | NA |
| u0.A24 | SERDES | INC1- |
| u3.317 | INC1- | NA |
| u0.B24 | SERDES | INC1+ |
| u3.318 | INC1+ | NA |

[CONNECT]

| | |
|---|---|
| u0.N23 | u1.3 |
| u0.M23 | u1.7 |
| u1.11 | u3.67 |
| u1.13 | u3.89 |
| u1.15 | u3.90 |
| u1.17 | u3.96 |
| u1.19 | u3.97 |
| u1.21 | u3.98 |
| u1.25 | u3.99 |
| u1.27 | u3.102 |
| u1.29 | u3.103 |
| u1.31 | u3.104 |
| u1.33 | u3.105 |
| u1.34 | u3.109 |
| u1.35 | u3.129 |
| u0.F23 | u1.36 |
| u0.F25 | u1.37 |
| u0.F26 | u1.38 |
| u0.G23 | u1.40 |
| u0.G24 | u1.41 |
| u0.F24 | u1.42 |
| u0.G25 | u1.43 |
| u0.G26 | u1.44 |
| u1.45 | u3.134 |
| u1.46 | u3.135 |
| u1.47 | u3.136 |
| u1.48 | u3.137 |

FIG. 23b

METHOD OF CREATING MCM PINOUTS

FIELD OF THE INVENTION

The present invention relates to a method for creating pinouts for integrated circuits generally and, more particularly, to a method for creating pinouts for multi-chip module (MCM) devices.

BACKGROUND OF THE INVENTION

A conventional approach to generating pinouts involves manually creating a complete substrate netlist, a pin grid of a ball grid array (BGA) package, a set of substrate rules, a software pins file and a marketing grid. Manual creation of tables and grids is time-consuming and prone to human error. Such errors can be difficult to isolate and can affect (i) datasheets, (ii) software that uses the pinout information (e.g., PLD placement software such as Warp™, a trademark of Cypress Semiconductor Corporation, San Jose, Calif.), (iii) substrate design, and (iv) other products that extract information from the pinout process.

In another conventional approach, complex spreadsheet formulae are used for the tables to create pinouts and grids. However, the spreadsheets can be impractical for some re-formatting and text manipulation work that is needed to translate a data source (i.e., the pinout table) to a data destination (i.e., the software pins file). Furthermore, spreadsheet formulae can be inflexible. Specifically, changing one aspect of data generation can require modification to every formula in the spreadsheet, a manual task that is prone to omission.

SUMMARY OF THE INVENTION

The present invention concerns a method for creating pinouts for inter-die connections comprising the steps of filling a number of columns of a computer readable file with information about pads and balls of the inter-die connections, marking the portions of the computer readable file indicating a correlation between pads and balls and generating a netlist according to one or more sets of computer executable instructions in the computer readable file.

The objects, features and advantages of the present invention include providing a method for creating pinouts for multi-chip module (MCM) devices that may (i) provide computer executable scripts to automate creation of a majority of the connection netlist, (ii) combine scripts and human control to create pinouts, (iii) provide scripts to produce different deliverables based on a connection netlist for different recipients needing information in the connection netlist to varying extents and in different formats, and/or (iv) efficiently create pinouts for MCM devices.

BRIEF DESCRIPTION OF THE DRAWINGS

These and other objects, features and advantages of the present invention will be apparent from the following detailed description and the appended claims and drawings in which:

FIG. 3 is a table illustrating an example of a connection netlist in accordance with the present invention;

FIG. 4 is a table illustrating another example section of a connection netlist in accordance with the present invention;

FIG. 8 is a flow diagram illustrating a ball grid generating process in accordance with a preferred embodiment of the present invention;

FIG. 9 is a chart illustrating an example ball grid in accordance with a preferred embodiment of the present invention;

FIG. 21 is a table illustrating example substrate routing rules;

FIGS. 23(a–b) are tables illustrating example entries in a software pins file in accordance with a preferred embodiment of the present invention.

DETAILED DESCRIPTION OF THE PREFERRED EMBODIMENTS

Figure 1:
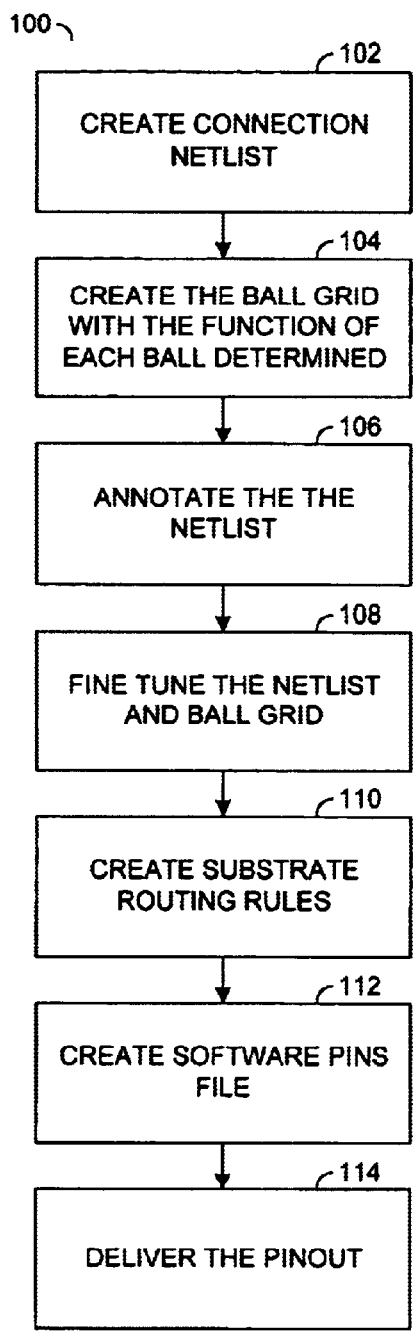
FIG. 1 is a flow diagram illustrating a pinout creation process in accordance with a preferred embodiment of the present invention.

Referring to FIG. 1, a flow diagram of a process (or method) 100 is shown in accordance with a preferred embodiment of the present invention. The process 100 may provide a detailed procedure for creating pinouts and other deliverables for, in one example, multi-chip module (MCM) devices. For example, the method 100 may be employed to provide pinouts for programmable serial interface (PSI) devices. (PSI™ is a trademark of Cypress Semiconductor Corporation, San Jose, Calif., referring to devices combining programmable logic and high-speed serial channels). PSI may be a family of devices: combining varying amounts of programmable logic gate density and a varying number and functions of transceiver channels (e.g., high-speed serial channels) across members. In one example, a PSI device may be a combination of a programmable logic device (PLD), a serializer/deserializer (SERDES) and a memory.

The present invention may concern MCMs with more than one die in the package or with more than one die having pads bonded to pins or balls. Additionally, the term "pinout" as used herein is broadly defined as a package of deliverables that may include, but is not limited to, (i) a complete substrate netlist that illustrates all pad-to-pad and pad-to-ball connections, (ii) a pin grid of the ball grid array (BGA) illustrating locations of balls and respective functions, (iii) a set of substrate rules for substrate routing design, (iv) a software pins file that may comprise the netlist in a software-friendly format (e.g., a Warp™ format or other applicable software format), and (v) a marketing grid. The present invention may be implemented as one or more sets of computer executable instructions for performing all or portions of the tasks involved in pinout generation and a method that may allow the pinout generation to be automated, less prone to human error, and/or more efficient.

An initial step of the process 100 may comprise creating a connection netlist (e.g., the block 102). The netlist generally shows a substrate connection property for each pad of each die of a multi-chip module (e.g., whether a pad connects to a ball, a pad of another die, etc.). Each routed pad may also be assigned a unique netname. A ball grid indicating the function of each ball may be created (e.g., the block 104). The netlist may be annotated so that die pads are assigned specific ball numbers from the ball grid (e.g., the block 106). The netlist and the ball grid may be fine-tuned to improve routing (eg., the block 108). The netlist may be annotated again (e.g., back annotated) to ensure the most up-to-date and accurate ball numbers for the pads. When the netlist and ball grid have been fine-tuned, the netlist is generally considered to be completed.

The process 100 may continue with the creation of substrate routing rules (e.g., the block 110). A software pins file may then be created (e.g., the block 112). When the process 100 is completed, a complete pinout package may be ready for delivery (e.g., the block 114). The general framework, sub-steps, rules of work, and one or more sets of computer executable instructions (e.g., scripts) may ensure quality while automating some or all of the tasks for efficiency.

Figure 2:
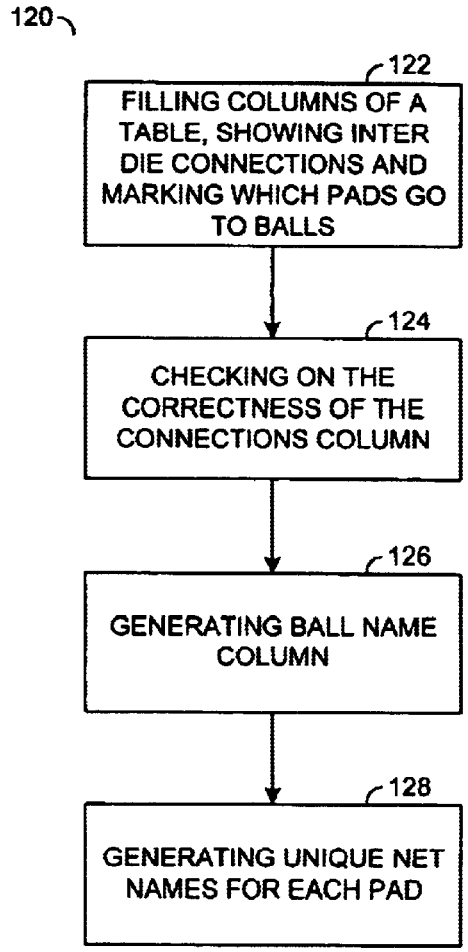
FIG. 2 is a flow diagram illustrating a netlist creation process in accordance with a preferred embodiment of the present invention.

Referring to FIG. 2, a flow diagram 120 is shown illustrating in more detail a process for creating a connection netlist in accordance with a preferred embodiment of the present invention. The connection netlist generally indicates all pad-to-pad and/or pad-to-ball connections of the device. The generation of the connection netlist may comprise a number of steps. A first step may comprise filling a number of columns of a computer readable file (e.g., columns A through R) with information indicating inter-die pad connections for a number of dies and marking which pads connect to balls. The information for filling the columns may be obtained from die-pad listings of each individual die (e.g., die pad sequence, die pad name, and coordinates). The die-pad listing of each individual die is generally created as part of the design and/or definition process of each individual die.

Figure 3:
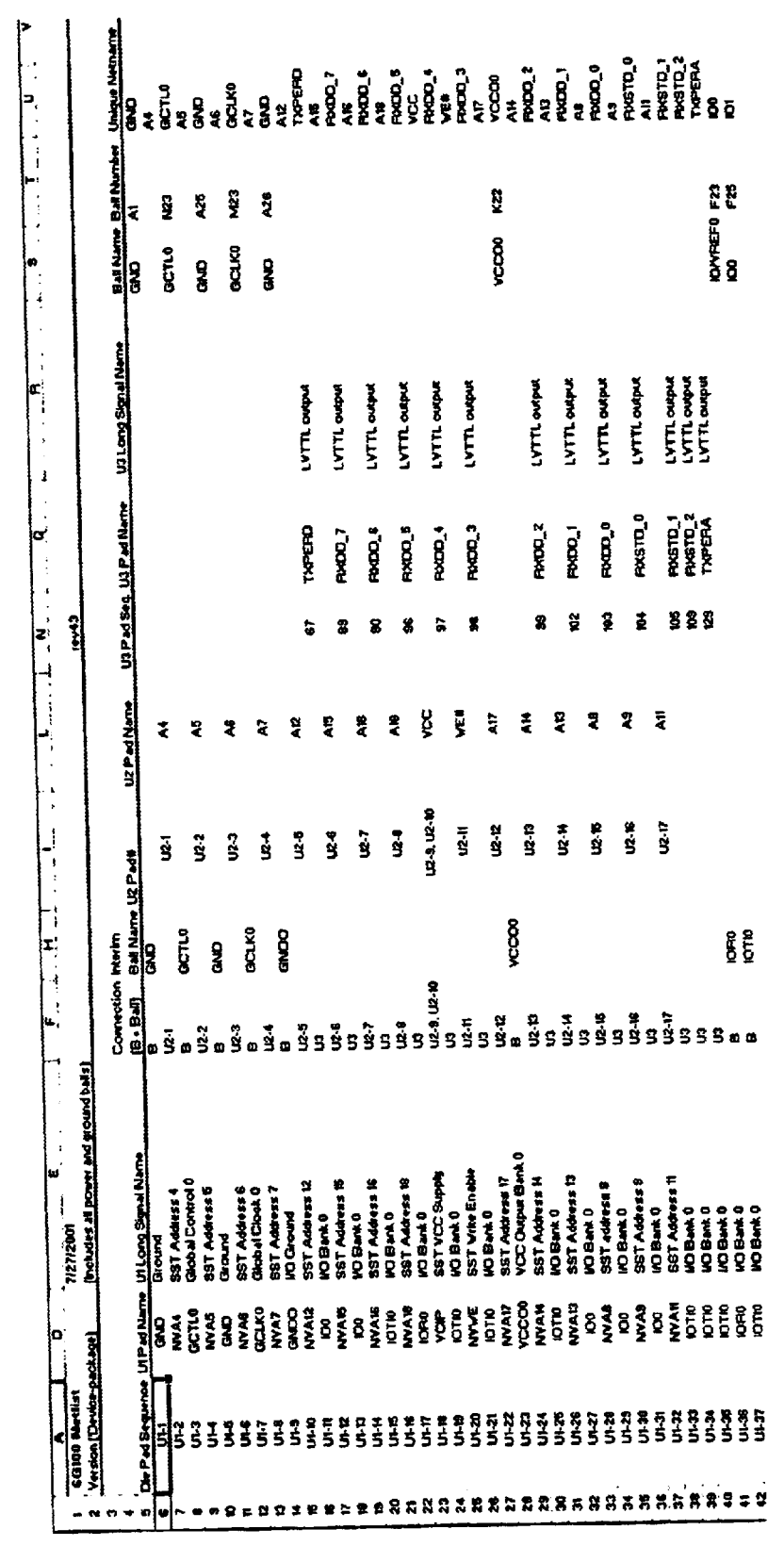
Figure 4:
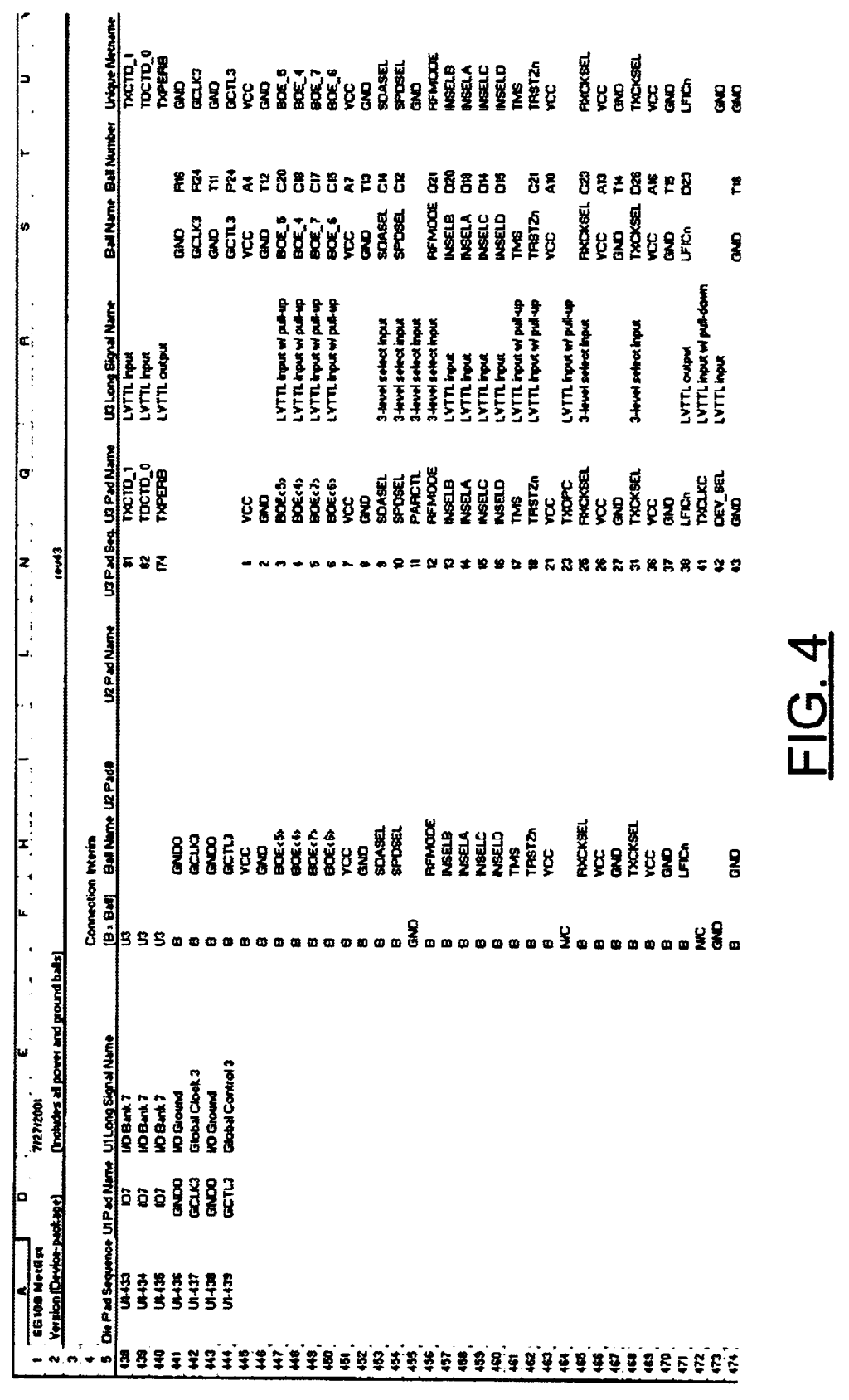

Example sections of a connection netlist in accordance with the present invention may be found in FIGS. 3 and 4. The netlist may contain connection information of a multi-chip module device. The MCM device may comprise, in one example, three chips U1, U2 and U3. However, other numbers of chips may be implemented accordingly to meet the design criteria of a particular application. In one example, the chip U1 may be a programmable logic device (PLD), the chip U2 may be a memory device (e.g., an on-chip EEPROM), and the chip U3 may be a transceiver. A first column of the computer readable file (e.g., column A) may contain the die pad numbers for U1. Different blocks of I/O may be differentiated by, in one example, a change in shading of the column. In another example, colors may be associated with the different blocks of I/O. As used herein, a block of I/Os is a group of I/Os that may share some physical, electrical or logical characteristics that differ from the characteristics of another block of I/Os. A second column (e.g., column D) may contain the die pad names for the chip U1. A third column (e.g., column E) may contain a brief explanation of the die pad for readability. A fourth (connection) column (e.g., column F) generally contains information indicating whether a pad connects to another die (e.g., U2 or U3), to a ball (e.g., "B"), or to a net in the substrate. A number of columns (e.g., columns I through L) generally comprise a corresponding set of columns for the chip U2, while another set of columns (e.g., columns N through R) may comprise a corresponding set of columns for the chip U3. Subsequent sets of columns for additional chips may be implemented accordingly to meet the design criteria of a particular application. A row in the netlist generally represents a connection. For example, row 16 in FIG. 3 generally shows pad U1-11 connecting to pad 67 of U3. In addition, pad coordinates for all pads may be contained in the computer readable file in, for example, columns B and C for U1, J and K for U2, and O and P for U3 (not shown)

A connection column (e.g., a column F of FIGS. 3 and 4) generally denotes whether a pad or set of pads in the current row connects to a ball, another die, a specific net, or has no connection. For example, referring to FIG. 4, the pad 11 of U3 is indicated to be connected to a net called "GND", while the pad 23 is indicated to be a no-connect pad, denoted by "N/C". In one example, a "B" may be used as the first character in a cell of the connection column to denote that the pad in the corresponding row generally connects to a ball.

An interim ball name column (e.g., column H of FIGS. 3 and 4) generally has a formula referring to the connection column that may generate the pad name whenever the pad is going to a ball. A ball name column may be generated from the interim ball name column in response to a set of computer readable instructions. The ball name column generally contains the names of all the balls used later by a grid making process as well as datasheets and software (e.g., the marketing names of the balls). The ball number column (e.g., a column T of FIGS. 3 and 4) generally indicates the ball number assigned to a pad connected to a ball. Each pad that is bonded (i.e., not a N/C pad) is generally assigned a unique netname. The unique netname is generally the name of the net (e.g., wire) on the substrate. Multiple rows may have the same unique netname (e.g., pads 27 and 37 of U3 both may have the same unique netname, GND). All pads having the same unique netname, regardless of pad name, are generally connected together in the substrate since the pads are assigned to the same net.

Referring to FIG. 4, a ball grid with the function of each ball indicated is shown. The creation of the ball grid may be performed, in one example, at substantially the same time as the customer pinout is defined (e.g., the block 104 of FIG. 1).

Figure 5:
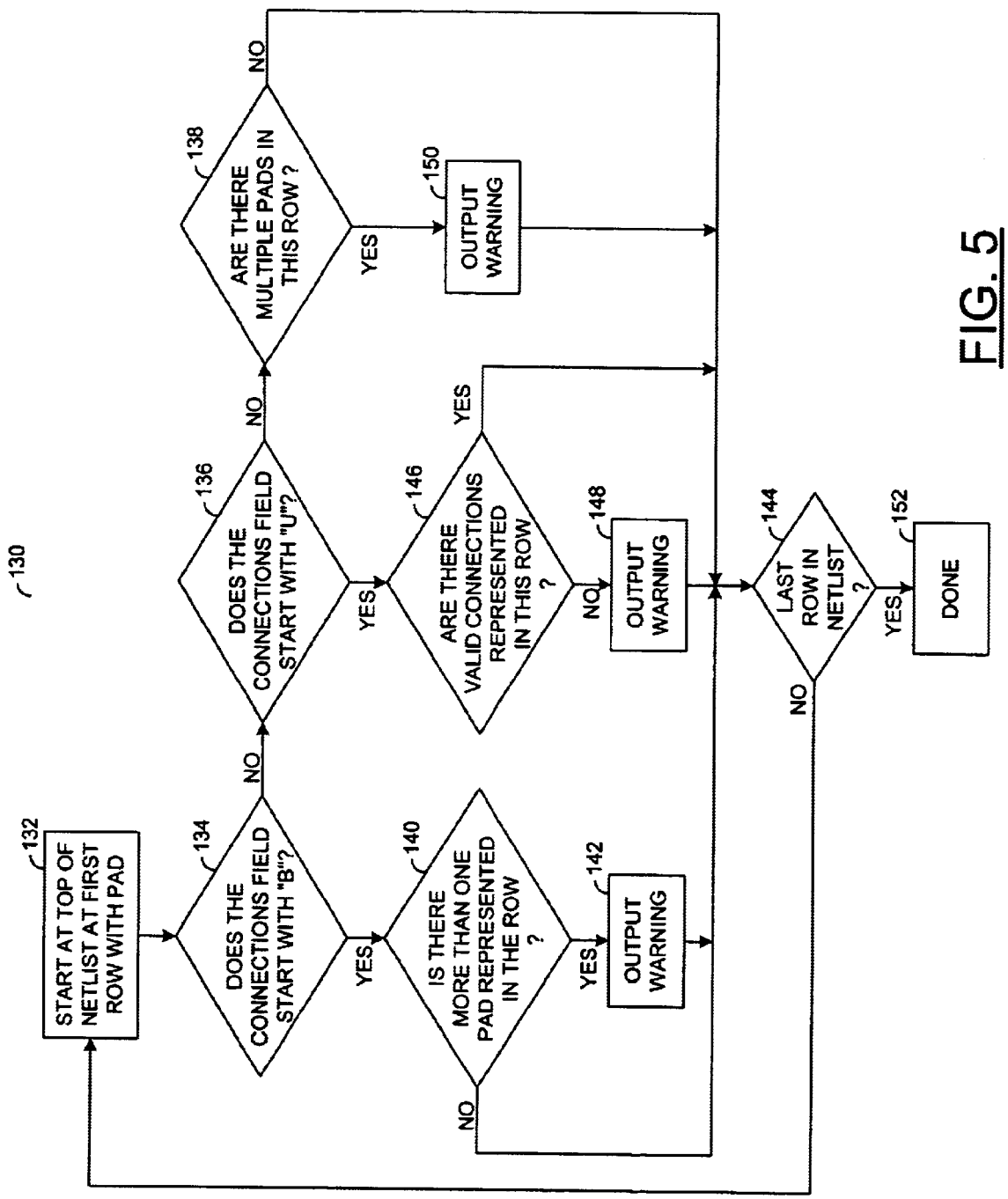
FIG. 5 is a flow diagram illustrating an error checking process in accordance with a preferred embodiment of the present invention.

Referring to FIG. 5, a flow diagram 130 is shown further detailing the step 124 of FIG. 2. The netlist may be checked for errors in the connections indicated. The process of checking the netlist generally begins with the first row comprising a pad (e.g., the block 132). The row is generally checked to determine whether the pad is a ball (e.g., the block 134), an inter-die connection (e.g., the block 136) or one of multiple pads (e.g., the block 138). For example, a ball may be indicated by, in one example, placing a letter "B" as the first character in a field describing the connection while an inter-die connection may be indicated by, in one example, placing a letter "U" as the first character in the field.

When the pad is a ball, the row is generally checked to determine whether the row contains more than one pad (e.g., the block 140). In one example, when the row contains more than one pad, an error indication may be generated (e.g., the block 142) and the process generally continues on to check further rows in the netlist (e.g., the block 144). Alternatively, when the row contains more than one pad, the error indication may be generated and the procedure may be exited. When the row does not contain more than one pad, the process 130 generally continues on to check further rows in the netlist (e.g., the block 144).

When the row contains an inter-die connection, the row is generally examined to determine whether the row represents valid connections (e.g., the block 146). In one example, when no valid connections are represented in the row, an error indication may be generated (e.g., the block 148) and the process generally continues on to check further rows in the netlist (e.g., the block 144). Alternatively, when no valid connections are represented in the row, an error indication may be generated and the procedure may be exited. When valid connections are represented in the row, the process generally continues on to any remaining rows in the netlist (e.g., the block 144).

When the pad in a row is neither a ball nor an inter-die connection, the process 130 may determine whether multiple pads are indicated in the row (e.g., the block 138). In one example, when multiple pads are indicated in a row, an error indication may be generated (e.g., the block 150) and the process generally continues on to check further rows in the netlist (e.g., the block 144). Alternatively, when multiple pads are indicated in a row, an error indication maybe generated and the procedure may be exited. When multiple pads are not detected in a row, the process 130 generally continues on to any remaining rows in the netlist (e.g., the block 140). When the last row of the netlist has been checked, the process generally ends (e.g., the block 152).

In general, the process 130 may be configured to provide warnings on items such as a U1 pad labeled as connecting to another die but not having and entry in the U2 or U3 column (e.g., the row does not show that the pad is connected to another die even though the pad is marked as such).

Figure 6:
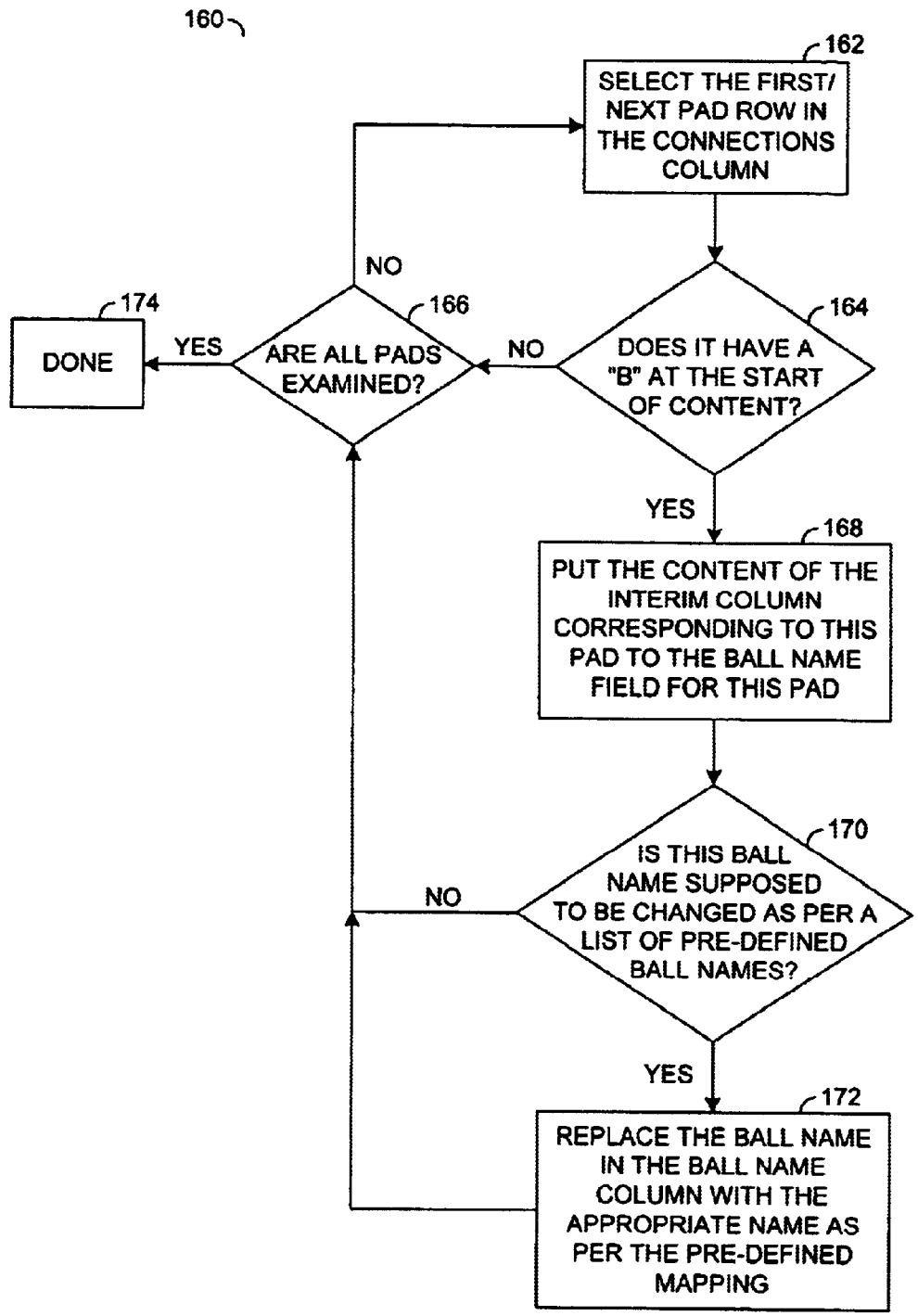
FIG. 6 is a flow diagram illustrating a ball name generating process in accordance with a preferred embodiment of the present invention.

Referring to FIG. 6, a flow diagram 160 is shown further detailing the step 126 of FIG. 2. The process 160 may be implemented for generating a column containing ball names (e.g., column S of FIGS. 3 and 4). Starting with the first row in the connections column containing a pad (e.g., the block 162), the process 160 may be configured to determine whether the pad is a ball (e.g., the block 164). When the pad is not a ball, the process 160 generally continues with a next row in the connections column containing a pad (e.g., the block 166). When the pad is a ball (e.g., the first character in the connection field is a "B"), the contents of an interim column (e.g., the column H of FIGS. 3 and 4) corresponding to the pad are generally placed in the ball name field for the pad (e.g., the block 168).

The ball name field may be checked to determine whether a change is desired in accordance with a list of predefined ball names (e.g., the box 170). When no change is desired, the process 160 generally moves on to the next row in the connections column containing a pad (e.g., the block 166). When a change of the ball name is desired, the ball name may be replaced in the ball name column with an appropriate name from a predefined mapping (e.g., the block 172). When all the pads in the connections column have been examined, the process 160 generally ends (e.g., the block 174).

The process 160 may be configured to examine the interim ball name column and produce the ball name column. Because a ball name generated by the process 160 and placed in the ball name column may be used to create the ball grid, a ball name for a particular pad may differ from the pad name. When the ball name differs from the pad name, the process 160 may be configured, in one example, to map the pad name to a desired ball name (e.g., the process 160 may comprise mapping pad names and the desired corresponding ball names). Alternatively, the process 160 may be configured to convert particular pad names and/or characters in the pad names to generate a desired ball name. As the process 160 processes the connection list to generate ball names, each pad name is generally examined to determine whether to change the name. The decision to change a name may be made, in one example, either because the pad name matches a name that is to be mapped or because the pad name satisfies predetermined criteria for conversion. When the pad name is changed, the process 160 is generally configured to enter the mapped ball name instead of the pad name into the computer readable file.

Figure 7:
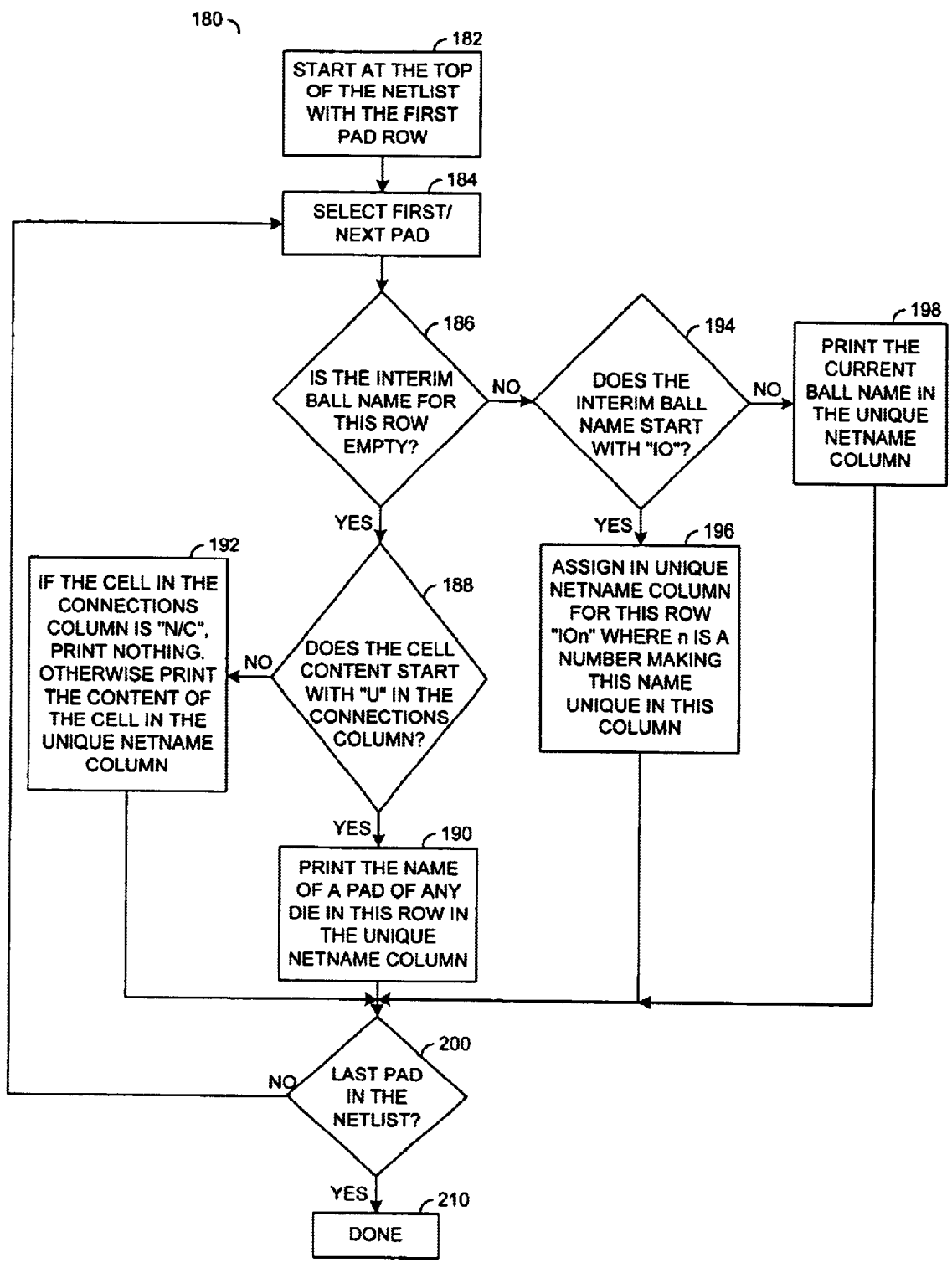
FIG. 7 is a flow diagram illustrating a netname generating process in accordance with a preferred embodiment of the present invention.

Referring to FIG. 7, a flow diagram 180 is shown further detailing the step 128 of FIG. 2. Unique net names generated for each bonded pad may be placed in a unique netname column (e.g., column U of FIGS. 3 and 4) The unique netname column is generally cleared of prior content first. The process for generating a unique net name for each bonded pad generally begins at the top of the netlist with the first pad row (e.g., the blocks 182 and 184). The interim ball name field for the row is generally examined to determine whether or not the field is empty (e.g., the block 186). When the interim ball name field is empty, the row is generally examined to determine whether the row contents indicate an inter-die connection (e.g., the block 188).

When the row contents describe an inter-die connection, the name of the pads of any other die to which the selected pad is connected is generally placed in the unique netname column (e.g., the block 190). When the row contents do not describe an inter-die connection, the name of the pad is generally placed in the unique netname column unless the pad is a no-connect pad (e.g., the block 192). When the interim ball name field for the row is not empty, the interim ball name may be examined to determine whether the row describes an I/O connection (e.g., the block 194). For example, an I/O connection may be designated, in one example, by starting the entry in the interim ball name field with the characters "I/O".

When the row describes an I/O connection, the name in the unique netname column is generally assigned a designation, for example, IOn, where n is a number selected to make the name unique (e.g., the block 196). When the row does not describe an I/O connection, the current ball name may be entered in the unique netname column (e.g., the block 198). The process 180 is generally repeated until all of the pads in the netlist have been examined (e.g., the block 200). When the entire netlist has been traversed, the process 180 generally terminates (e.g., the block 210).

Figure 9:
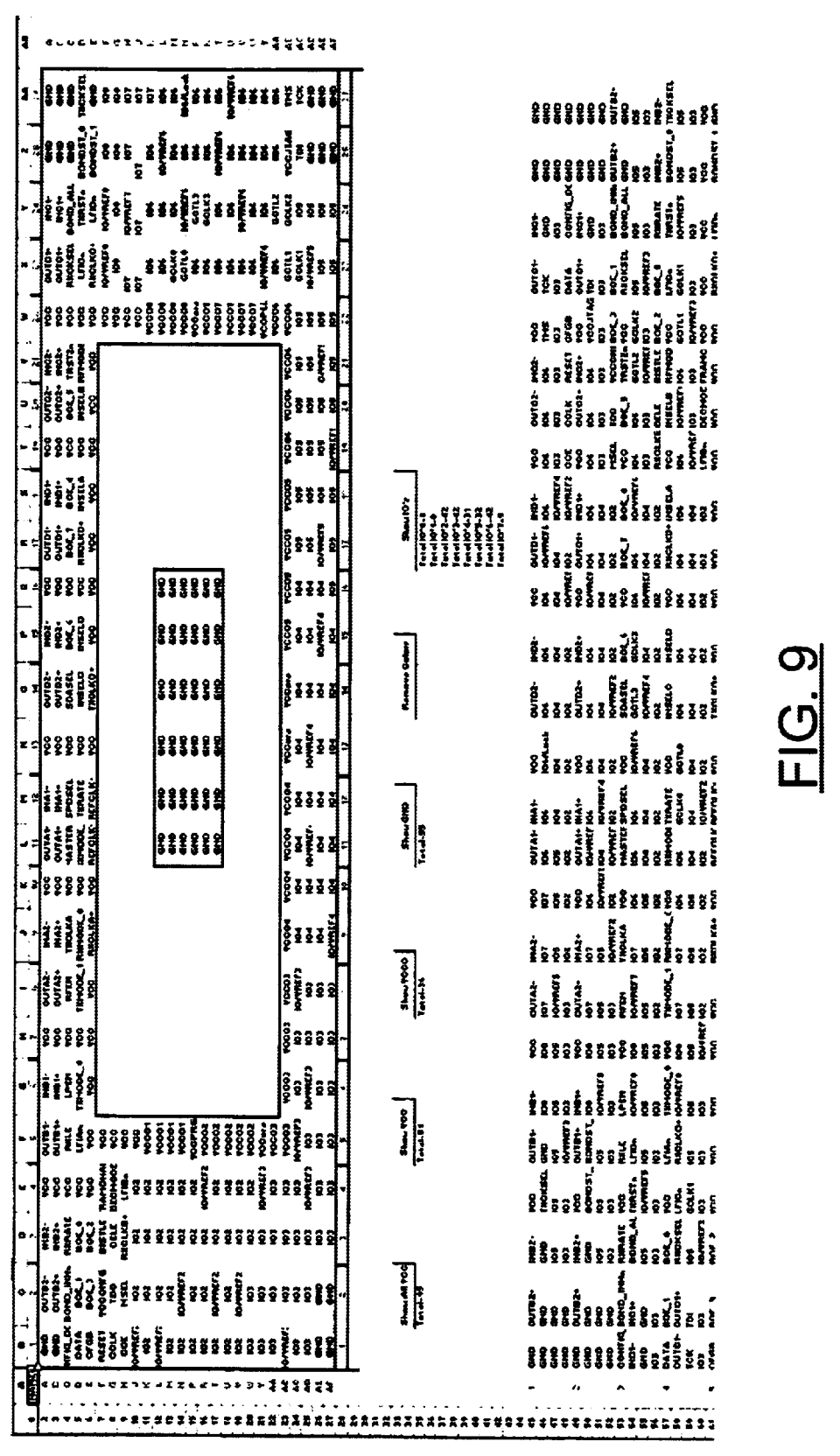

Referring to FIG. 8, a flow diagram 220 is shown further detailing the block 104 of FIG. 1. The step of creating the ball grid generally starts with generating a list of balls for the entire device (e.g., the block 222). When the list of balls has been generated, a representation of the ball grid may be generated by bordering a set of cells (e.g., the block 224) in a computer readable file (e.g., a spreadsheet). Each cell in the bordered region generally represents a ball. Each name in the ball list generated in the previous step is generally placed into a cell to represent the function of the ball. An example of a ball grid in accordance with the present invention is shown generally in rows 1 through 28 of FIG. 9. The ball list and the ball grid may be compared to check for errors (e.g., typographical, etc.) in the ball grid (e.g., the block 226). A further check of the ball grid may be performed for a rotational short (e.g., the block 228).

Figure 10:
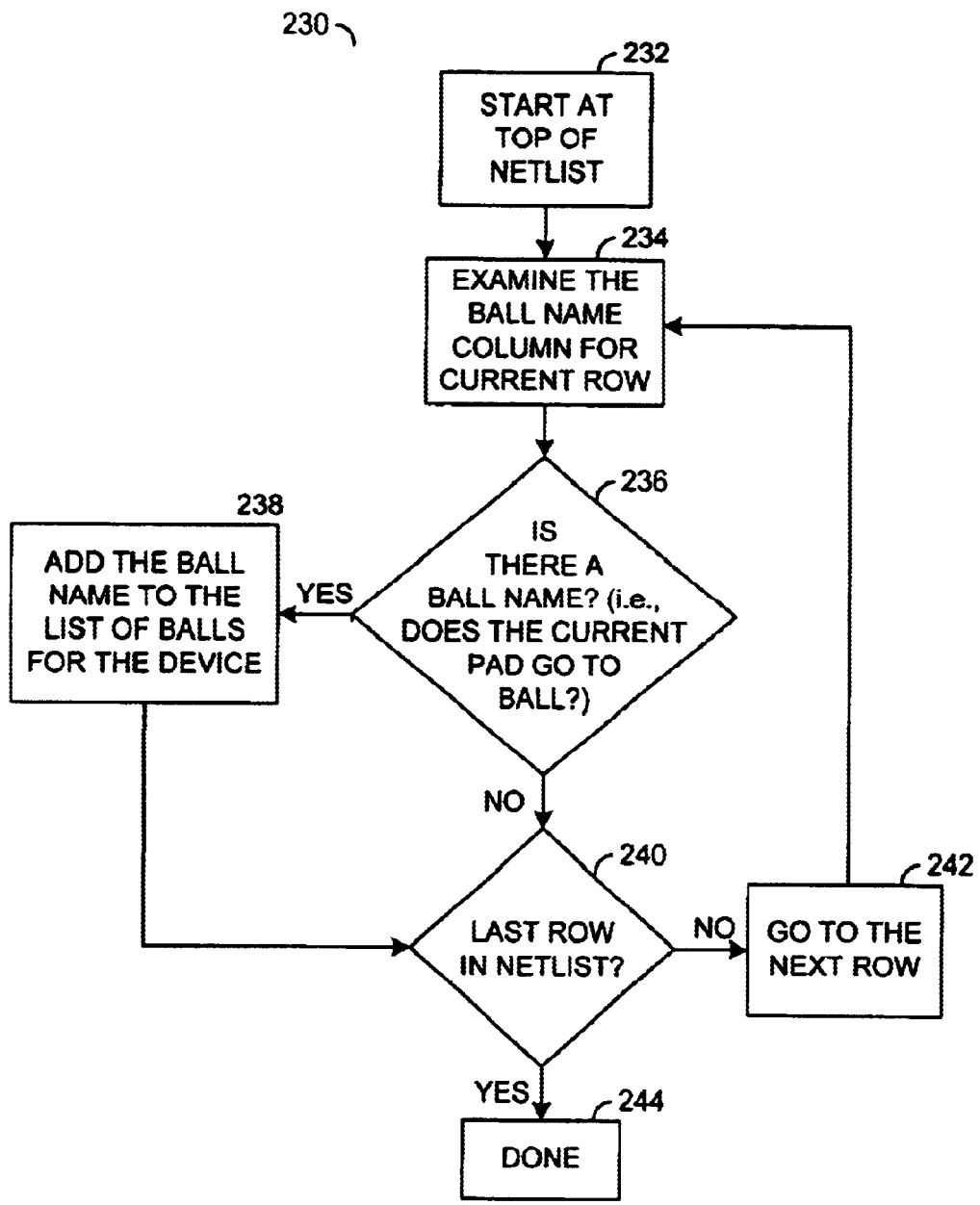
FIG. 10 is a flow diagram illustrating a ball list generating process in accordance with a preferred embodiment of the present invention.

Referring to FIG. 10, a flow diagram 230 is shown further detailing the step 222 of FIG. 8. The process of generating a list of balls for the device generally begins at the top of the netlist (e.g., the block 232). The contents of the ball name column for the current row may be examined (e.g., the block 234). When the ball name column for the current row is not blank (e.g., the current pad goes to a ball), the ball name: may be added to the list of balls of the device (e.g., the blocks 236 and 238). When the ball name column is blank, the process 230 generally moves on to the next row in the netlist (e.g., the blocks 240 and 242). The process 230 is generally repeated until all the rows in the netlist have been examined. When all the rows in the netlist have been examined, the process of generating the list of balls is generally complete (e.g., the block 244).

The present invention may implement rules and best practices for grid making. For example, center balls may be designated as GND for thermal and manufacturing reasons. In anticipation of a ground plane, ground balls may be placed in the corners to reduce ground variance. Locations of balls may be balanced, especially power supplies. In one example, power supplies may be concentrated on an inner ring. Balls are generally assigned with consideration of the pads to which the balls are connected so that routing may be improved, if not optimized. For example, when a transceiver die is to be placed on top of a PLD die, the balls associated with the transceiver die may be located on the top half of the grid. In general, when the package is rotated by any multiple of 90 degrees, no power supply should fall on a ground location (e.g., a rotational short).

Figure 11:
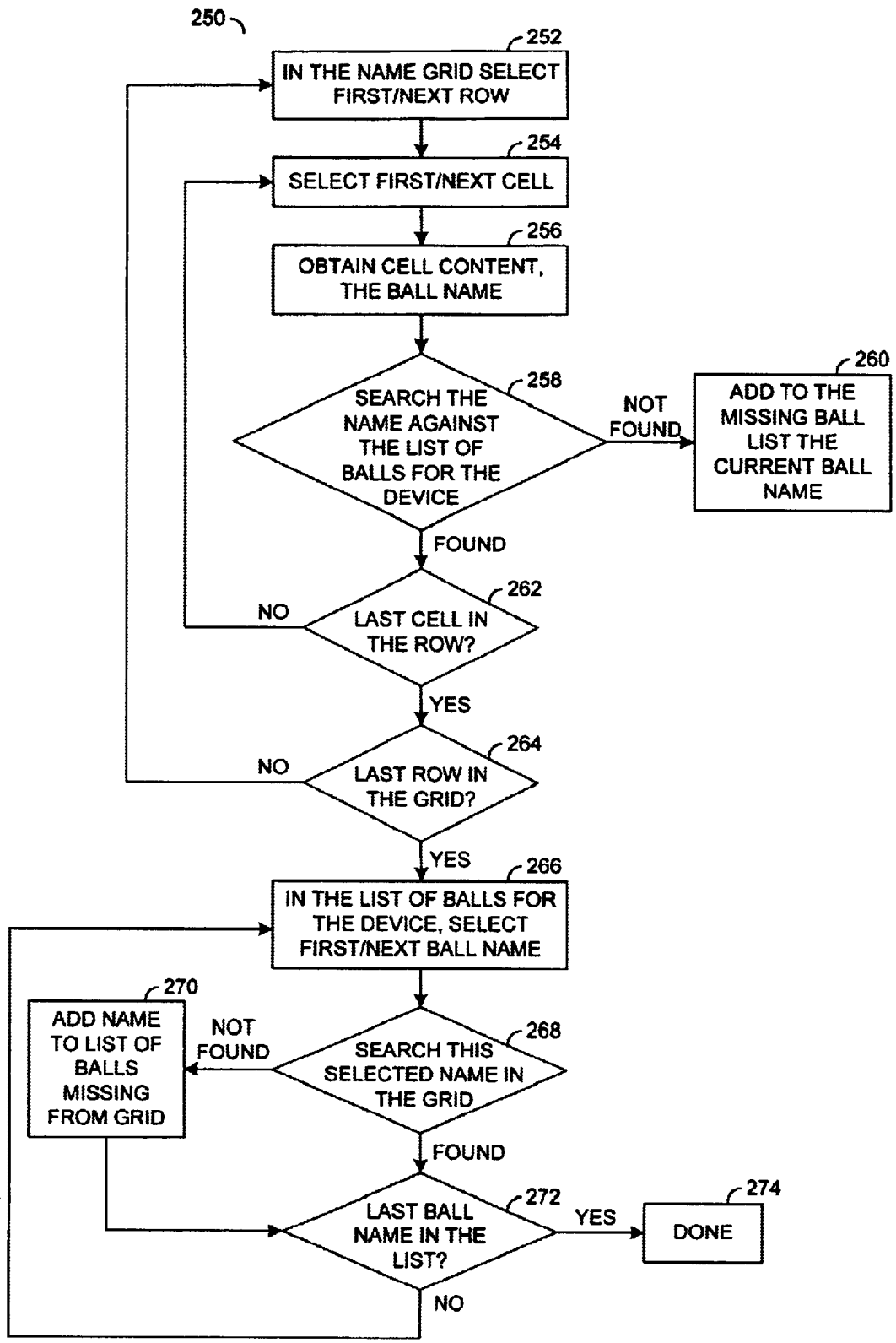
FIG. 11 is a flow diagram illustrating a another error checking process in accordance with a preferred embodiment of the present invention.

Referring to FIG. 11, a flow diagram 250 further detailing the step 226 of FIG. 8 is shown. The step 226 may begin by selecting the first row of the name grid (e.g., the block 252). The contents of the first cell of the row may be obtained (e.g., the block 256) and checked for a ball name. When a ball name is found, the ball name may be checked against a list of balls for the device (e.g., the block 258). When a ball name is not found, the ball name is added to a list of missing balls for the device (e.g., the block 260). When the list of missing balls is updated or a ball name is found, the next row is selected and examined. When all the cells (e.g., the block 262) and all the rows (e.g., the block 264) in the grid have been examined, the process moves on to checking the list of balls for the device against the ball grid starting with the first ball name in the ball list (e.g., the block 266). A search may be made of the ball grid to see whether the ball name is present (e.g., the block 268). When the ball name is not found in the grid, the ball name is added to a list of ball names missing from the grid (e.g., the block 270). Otherwise, the process continues with the next ball name in the list (e.g., the block 272). When the entire list has been checked, the process is generally complete (e.g., the block 274).

Figure 12:
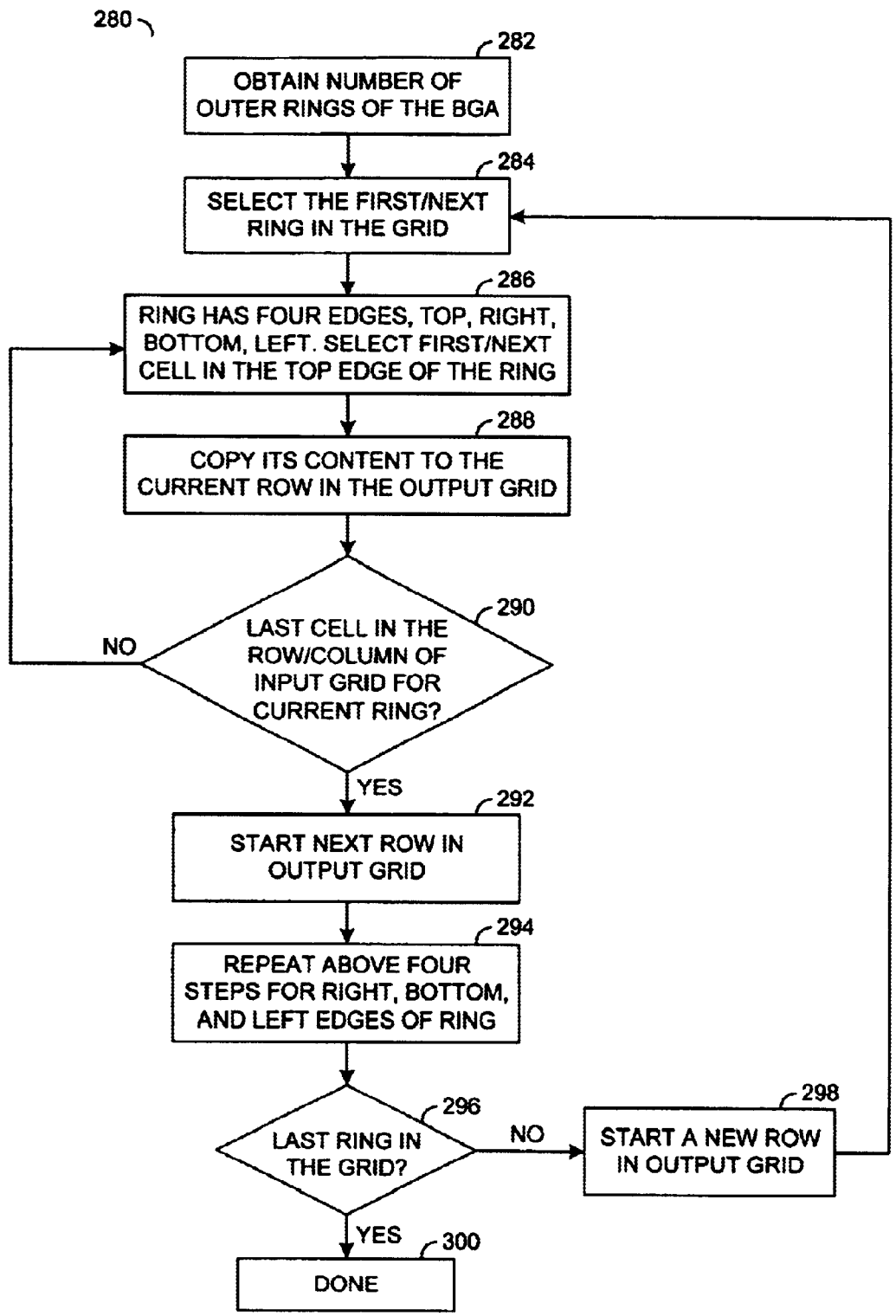
FIG. 12 is a flow diagram illustrating a rotation map generating process in accordance with a preferred embodiment of the present invention.

Referring to FIG. 12, a flow diagram 280 is shown further detailing the step 228 of FIG. 8. The process of checking for rotational shorts may begin by generating a rotation map. An example of a rotation map in accordance with the present invention may be found starting in row 45 of FIG. 10. The first step of generating a rotation map may be to obtain a number of outer rings of the ball grid array (BGA) for the devices (e.g., the block 282). Each ring of the grid is generally selected for examination (e.g., the block 284). The contents of cells forming a first edge (e.g., a top edge) of the ring are selected (e.g., the block 286) and copied to an output grid (e.g., the block 288). The content of each cell is copied until all of the cell contents of an edge of the current ring have been copied to the output grid (e.g., the block 290). When the cells of one edge have been copied to the output grid, the process continues with each of the other edges (e.g., right, left, bottom, etc.) of the ring (e.g., the block 294). When a ring has been completely copied to the output grid, a check is made to determine whether other rings remain to be copied (e.g., the block 296). When there are other rings to be copied, the process continues by repeating the steps 286–294 for each of the other rings (e.g., the block 298). When all of the rings have been copied to the output grid, the process is generally finished (e.g., the block 300).

Figure 13:
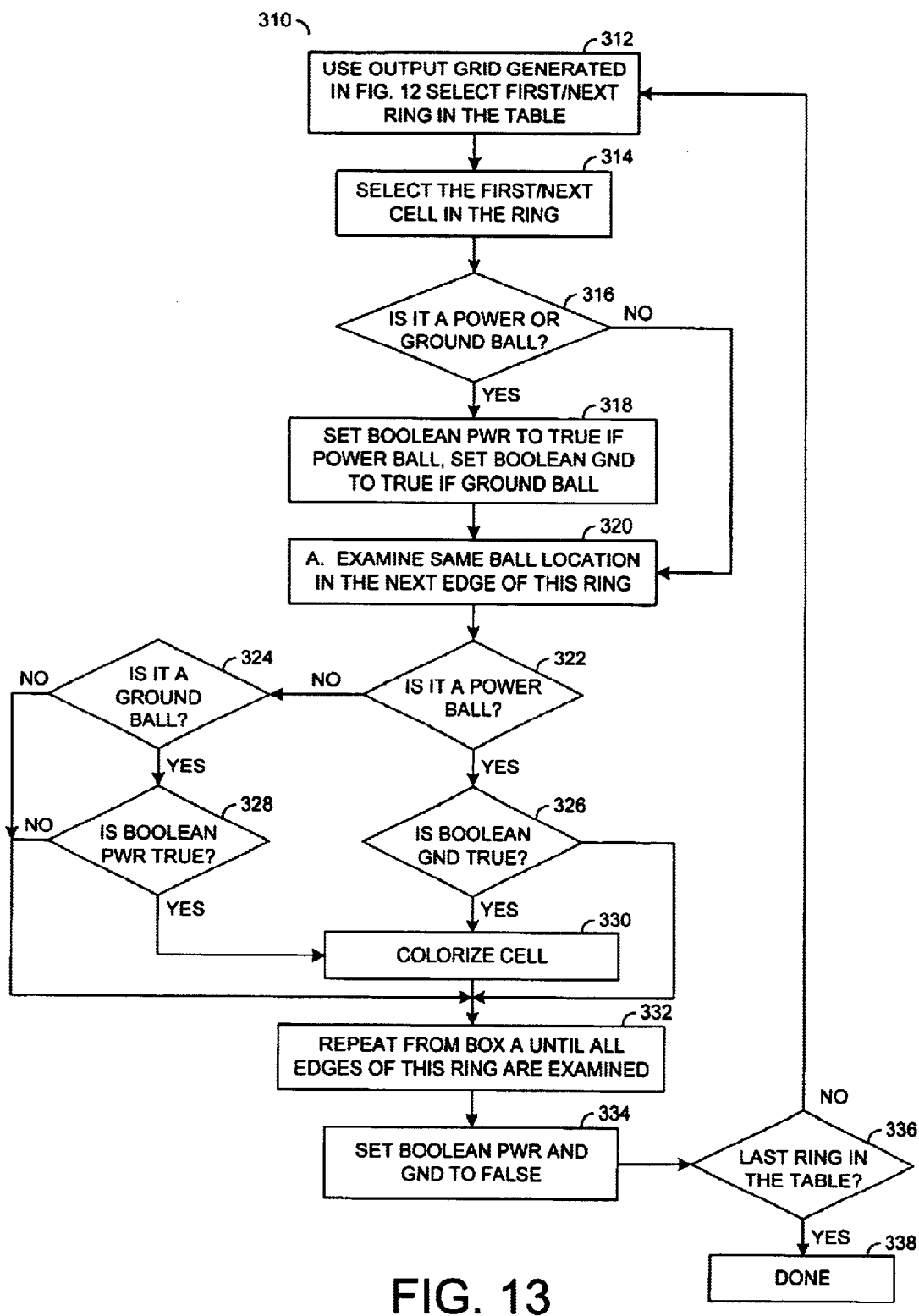
FIG. 13 is a flow diagram illustrating a rotational short detection process in accordance with a preferred embodiment of the present invention.

Referring to FIG. 13, a flow diagram 310 is shown further detailing the block 228 of FIG. 8. The process for checking for rotational shorts may continue by selecting a first ring in the output grid generated in accordance with the flow diagram 280 of FIG. 12 (e.g., the block 312). Each of the cells of the ring may be selected (e.g., the block 314) and checked to determine whether the cell is a power or a ground ball (e.g., the block 316). When a cell contains a power or a ground ball, a respective boolean expression (e.g., PWR or GND) may be set to a logical value of TRUE (e.g., the block 318). When the cell does not contain a power or ground ball, a cell in a similar location on another edge of the ring is checked (e.g., the block 320). When the cell in a similar location on another edge of the ring is determined to contain a power or a ground ball, the cells are compared to determine whether a conflict exists (e.g., the blocks 322–326). When the cells in similar locations on different edges of the ring have different functions (e.g., power vs. ground), the cell may be marked (e.g., shaded or colored) to indicate the possibility of a rotational short. In one example, the cell may be colored (e.g., the block 330). The process of checking the cells for a power or ground ball may be repeated for each edge of the ring (e.g., the block 332). Once all the edges of a ring have been examined, the values PWR and GND may be reset to a logical value of FALSE (e.g., the block 334). The process may be repeated for other rings in the output grid. When all the rings have been checked, the process generally terminates (e.g., the block 338).

Figure 14:
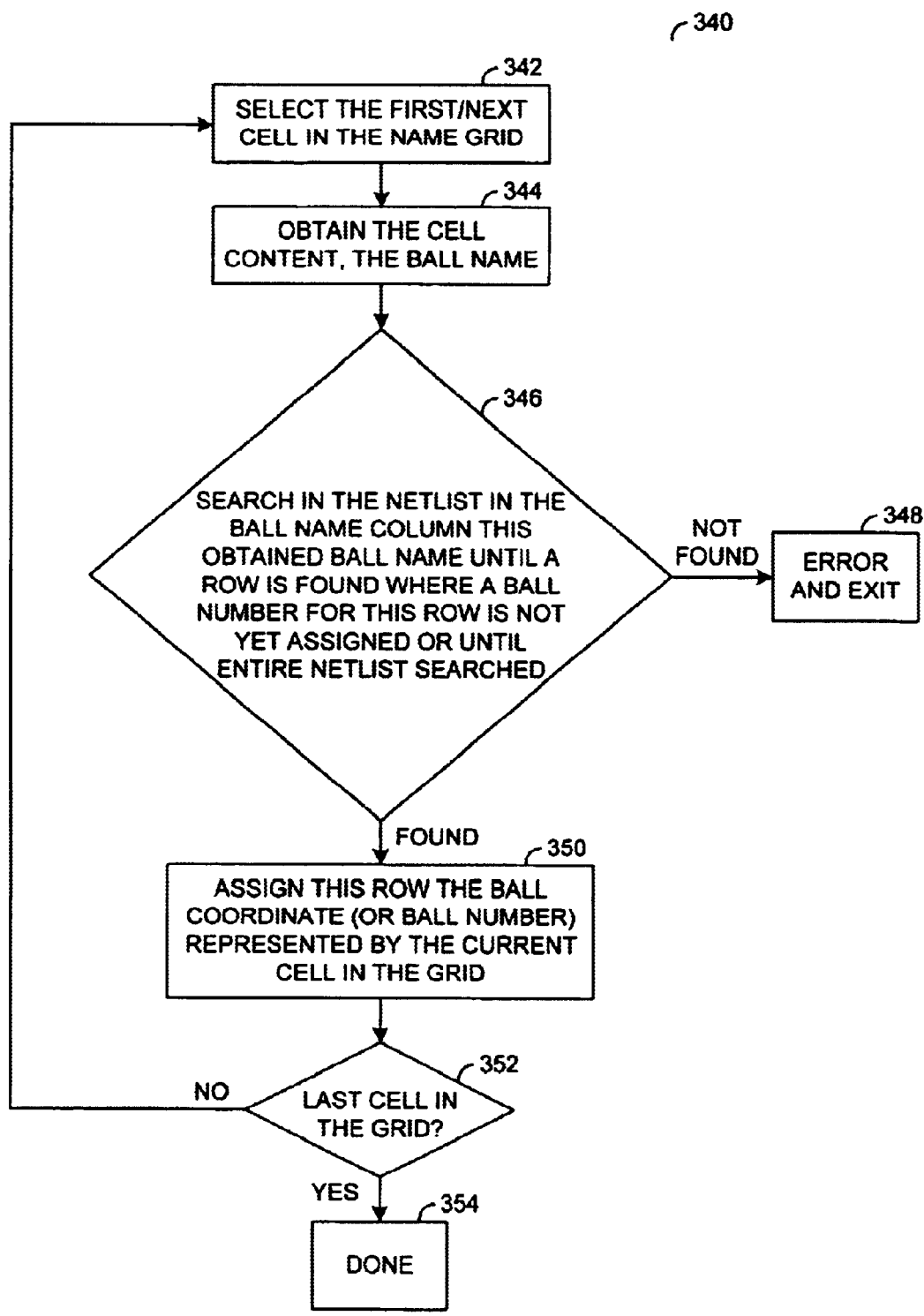
FIG. 14 is a flow diagram illustrating a netlist annotating process in accordance with a preferred embodiment of the present invention.

Referring to FIG. 14, a flow diagram 340 is shown further detailing the step 106 of FIG. 1. The netlist may be back annotated with the ball coordinates of the associated ball names in the ball grid. The contents of the ball name column are generally cleared before performing the back annotation. The process 340 generally begins by selecting a cell in the name grid (e.g., the block 342). The contents of the cell (e.g., a ball name) are generally obtained (e.g., the block 344). A search of the ball name column of the netlist is generally performed to find a row containing the ball name obtained from the cell. When the entire netlist is searched and the ball name is not found, an error indication may be generated and the process terminated (e.g., the block 348). When the ball name is found, the ball coordinate (or ball number) of the current cell of the ball grid may be assigned to the row of the netlist containing the ball name (e.g., the block 350). Each of the cells in the name grid is generally checked (e.g., the block 352). When all of the cells in the name grid have been checked, the process terminates (e.g., the block 354).

Figure 15:
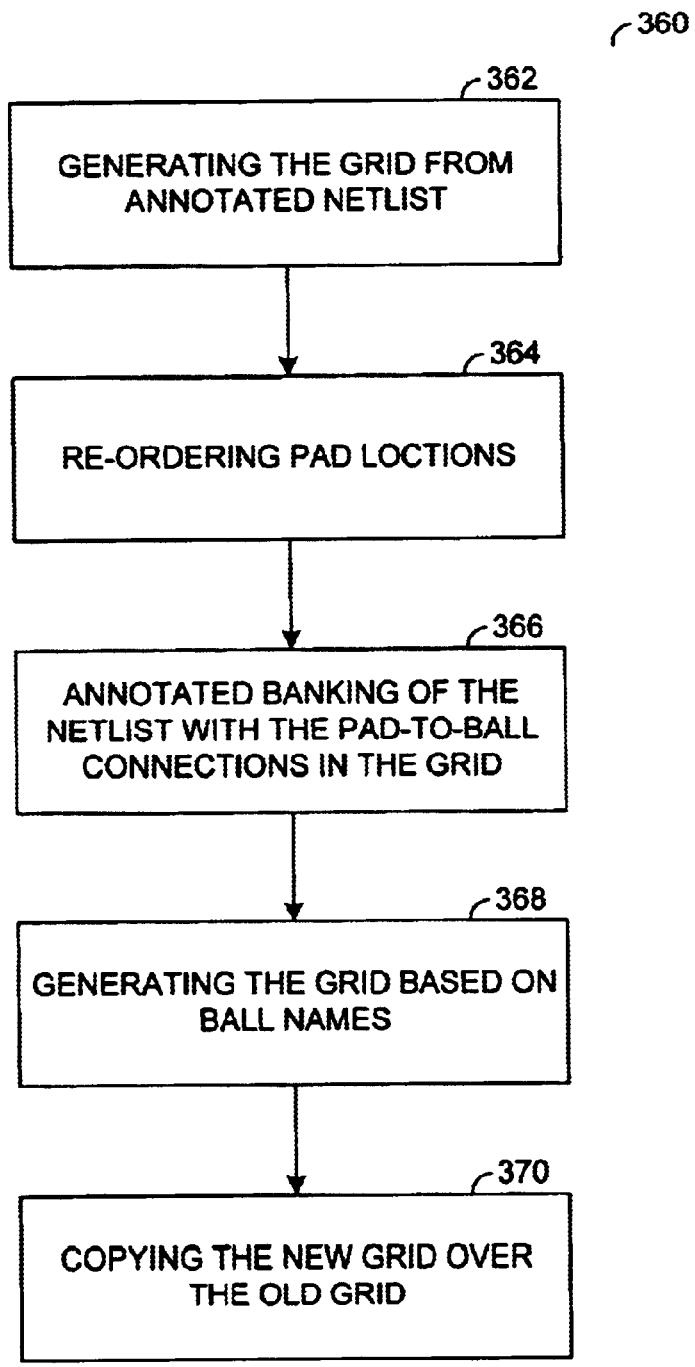
FIG. 15 is a flow diagram illustrating a fine tuning process in accordance with a preferred embodiment of the present invention.
Figure 16:
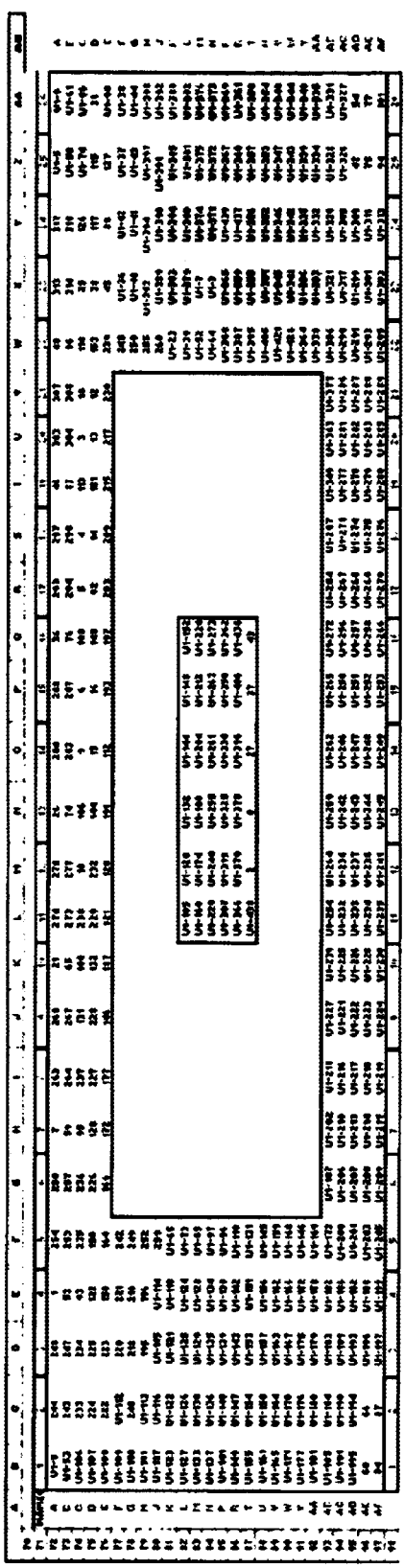
FIG. 16 is a pad grid diagram in accordance with a preferred embodiment of the present invention.

Referring to FIG. 15, a flow diagram 360 is shown further detailing the step 108 of FIG. 1. The netlist and ball grid may be fine tuned. A pad grid may be used. An example of a pad grid in accordance with a preferred embodiment of the present invention may be found in FIG. 16. The pad grid may be similar to the grid of FIG. 10. However, the pad grid may have a pad number for each ball rather than a ball name. The pad grid may be located in the same computer readable file as the netlist. The process for fine tuning the netlist and ball grid may begin by generating the pad grid from the annotated netlist (e.g., the block 362). The pad locations may be reordered as appropriate (e.g., the block 364). For example, pad ordering that radiates out from the die generally promotes ease of routing. For example, for a PLD where the I/Os in a bank all have the same names, reordering may be important to allocate specific pad-to-ball connections. The reordering step may affect substrate routability. Annotated banking of the netlist with the pad to ball connections in the grid may be performed in a subsequent step (e.g., the block 366). A new grid may be generated based on the ball names (e.g., the block 368). The new grid may be copied over the old grid (e.g., the block 370).

Figure 17:
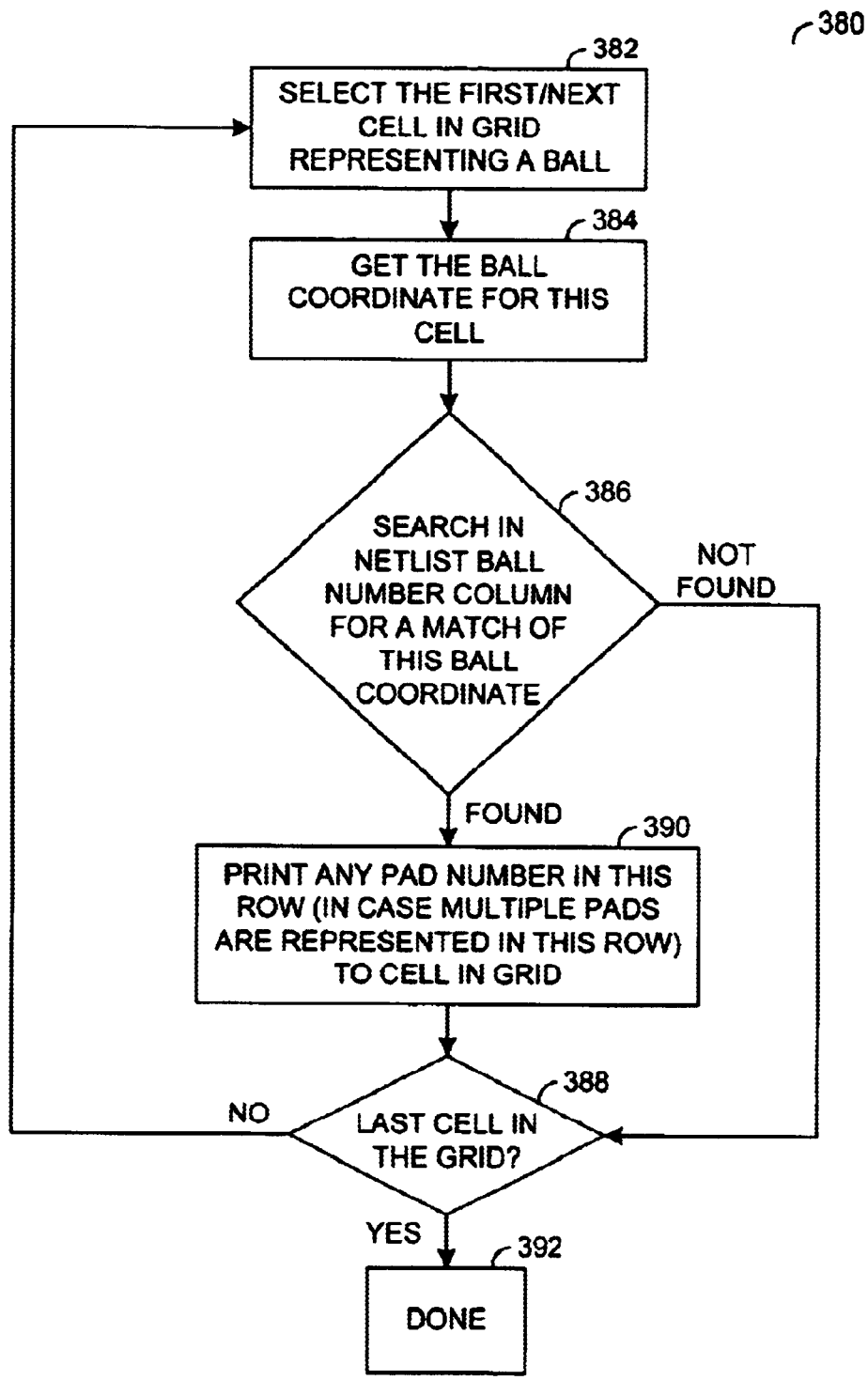
FIG. 17 is a flow diagram illustrating a pad grid generating process in accordance with a preferred embodiment of the present invention.

Referring to FIG. 17, a flow diagram 380 is shown further detailing the step 362, of FIG. 15. Fine tuning the netlist and ball grid may begin by generating the pad grid from the annotated netlist. The process of generating the pad grid from the annotated netlist may begin by selecting cells in the grid representing balls (e.g., the block 382). The ball coordinate is obtained from the selected cell (e.g., the block 384). The netlist is then searched for a matching ball coordinate (e.g., the block 386). When a matching coordinate is not found, the process moves on to a next cell (e.g., the block 388). When a matching ball coordinate is found, any pad numbers found in the row are entered in the pad grid (e.g., a block 388). When all of the cells in the grid have been checked, the process terminates (e.g., the block 392).

Figure 18:
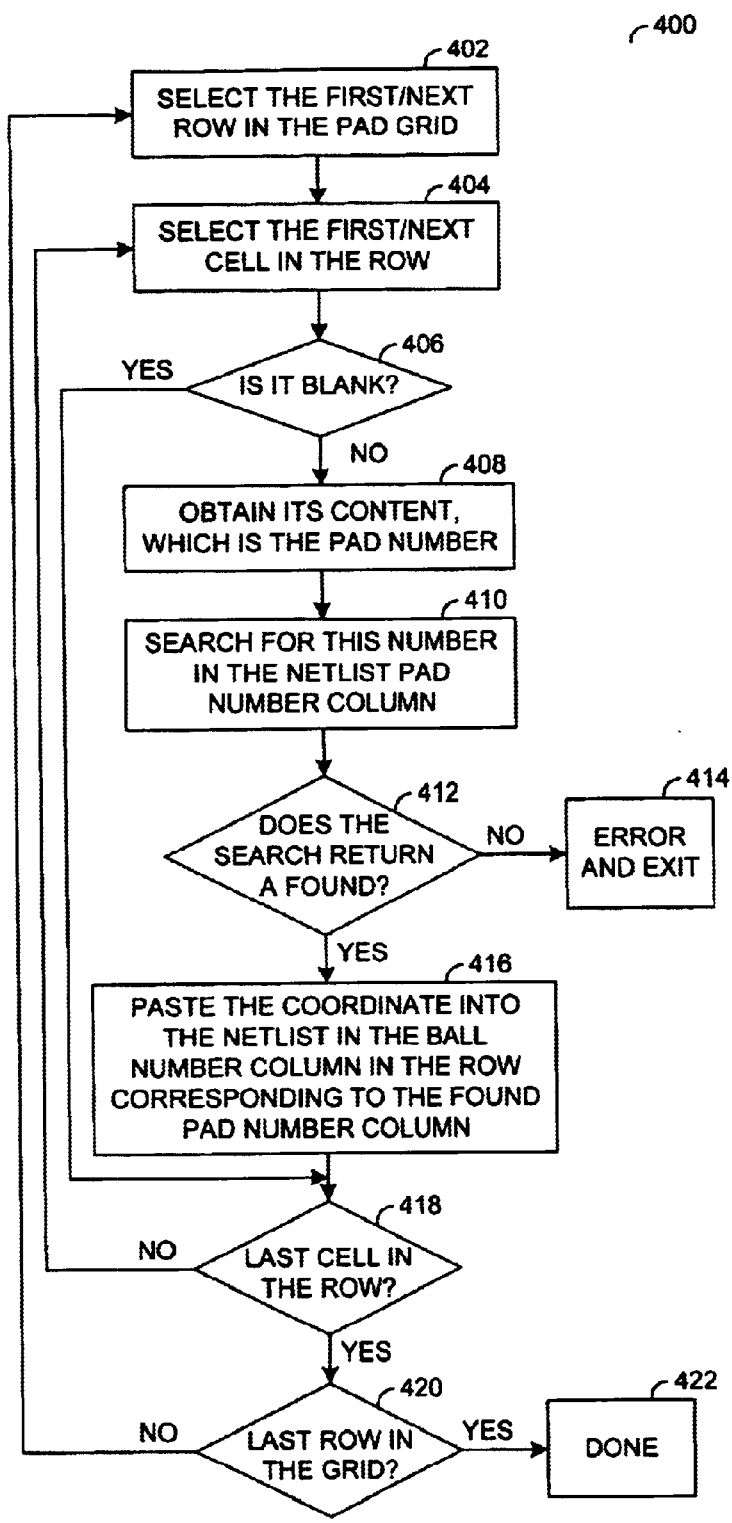
FIG. 18 is a flow diagram illustrating a netlist ball number annotating process in accordance with a preferred embodiment of the present invention.

Referring to FIG. 18, a flow diagram 400 is shown further detailing the step 366 of FIG. 15. When the reordering step 364 of FIG. 15 is done, the netlist may be back annotated with the pad-to-ball connections in the pad grid (e.g., the block 366 of FIG. 15). The ball number column of the netlist is generally cleared first. The process 400 generally begins by selecting a row in the pad grid (e.g., the block 402). A cell in the selected row may be selected (e.g., the block 404). The cell is generally examined to determine whether the cell is blank (e.g., the block 406). When the cell is not blank, the contents of the cell are obtained. For example, a pad number may be obtained (e.g., the block 408). The pad number column of the netlist may be searched for the pad number obtained in step 408 (e.g., the block 410). When the search of the netlist for the pad number is not successful, an error indication may be generated and the process ended (e.g., the blocks 412 and 414). When a match for the pad number is found in the netlist, the coordinates of the match may be placed into the netlist in the ball number column and the row corresponding to the found pad number column (e.g., the block 416). When the coordinates are placed into the netlist or when the cell is found to be blank, other cells in the row may be examined (e.g., the block 418). When a row is completely checked, the process continues with the next row until all the rows in the grid have been checked (e.g., the block 420). When all the rows in the grid have been checked, the process terminates (e.g., the block 422).

Figure 19:
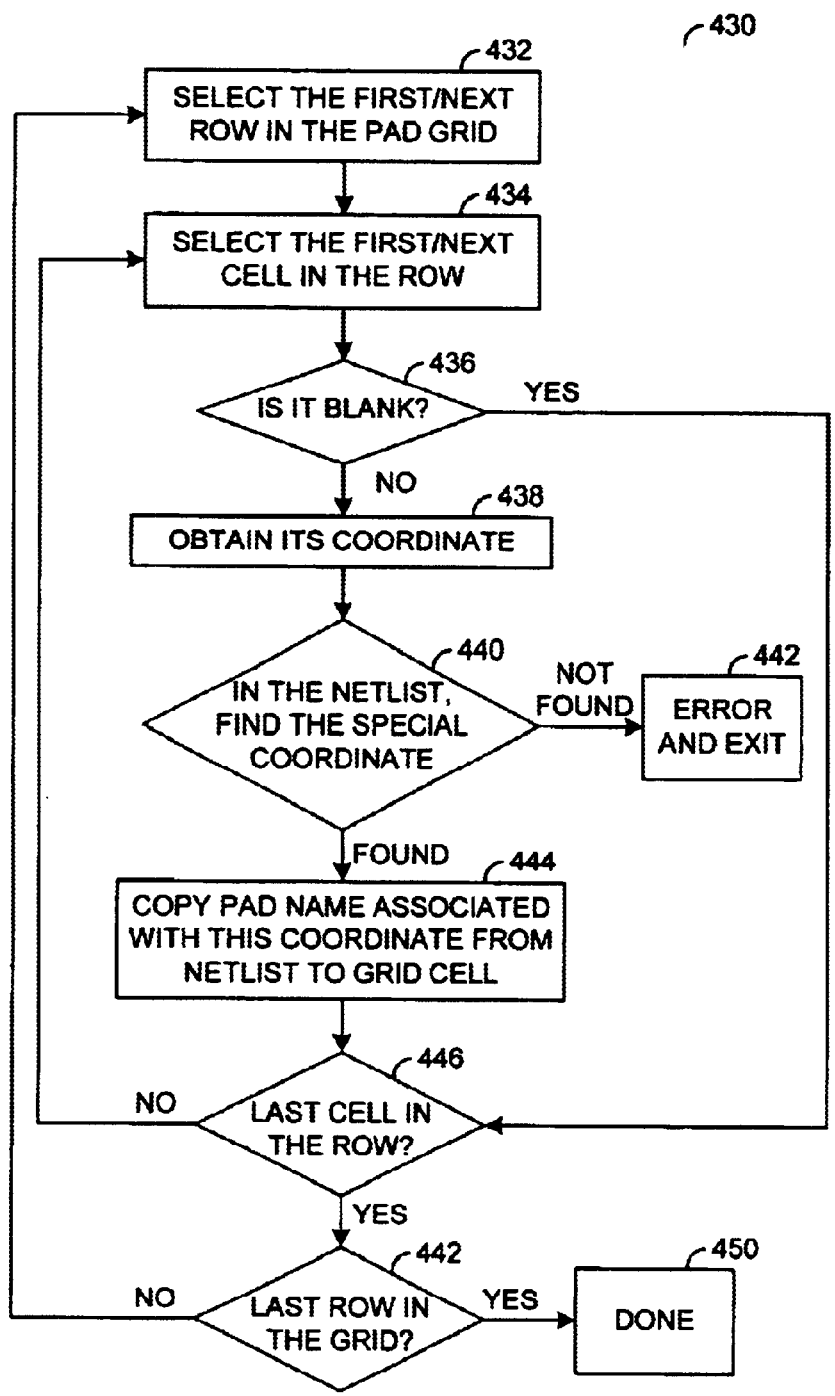
FIG. 19 is a flow diagram illustrating a name grid generating process in accordance with a preferred embodiment of the present invention.
Figure 20:
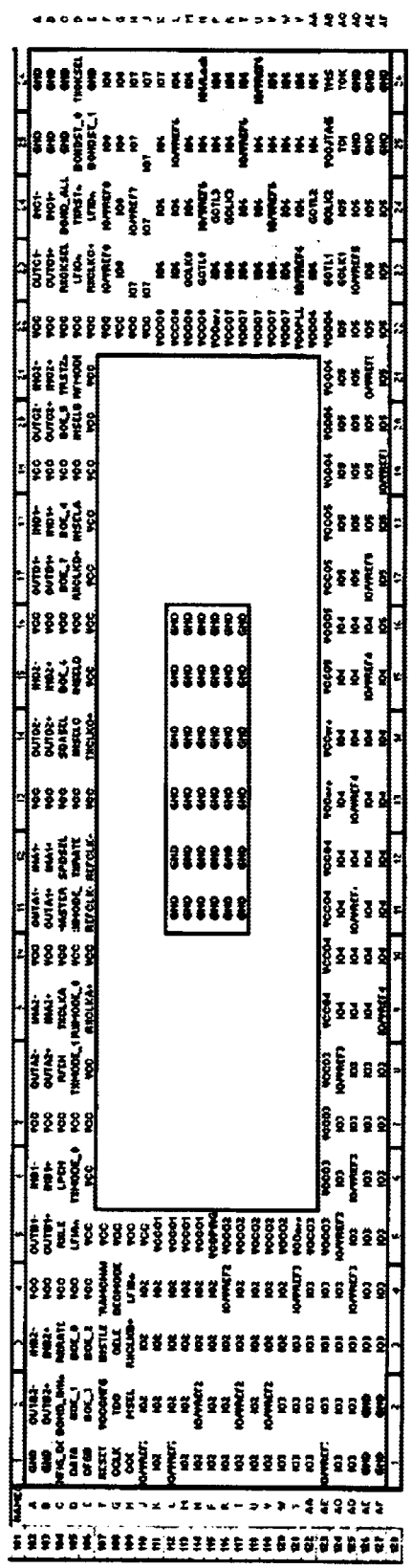
FIG. 20 is an example pin grid diagram in accordance with a preferred embodiment of the present invention.

Referring to FIG. 19, a flow diagram 430 is shown further detailing the step 368 of FIG. 15. A name grid showing ball names in ball locations may be generated based on ball names in the netlist (e.g., the block 368). An example of a name grid in accordance with a preferred embodiment of the present invention may be found in FIG. 20. The new grid generally serves as an intermediary for comparison with the grid created in connection with step 224 (described in connection with FIG. 8). When all of the new name grid is satisfactory, the new grid may be copied over the old grid to ensure conformance (e.g., the block 370).

The process 430 may begin by selecting a row in the pad grid (e.g., the block 432). A cell in the row is then selected (e.g., the block 434). The cell is examined to determine whether or not the cell is blank (e.g., the block 436). When the cell is not blank, the coordinate of the cell may be obtained (e.g., the block 438). The netlist is then examined to find the coordinate of the cell (e.g., the block 440). When the coordinate is not found in the netlist, an error indication may be generated and the process terminated (e.g., the block 442). When the coordinate of the cell is found in the netlist, the pad name associated with the coordinate may be copied from the netlist to the grid cell (e.g., the block 444). When the coordinate has been copied or when the cell is blank, the process may continue for each of the remaining cells (e.g., the block 446) and each of the remaining rows in the grid (e.g., the block 448). When the entire grid has been checked, the process terminates (e.g., the block 450). The netlist is generally considered complete and may be ready for substrate routing.

Figure 21:
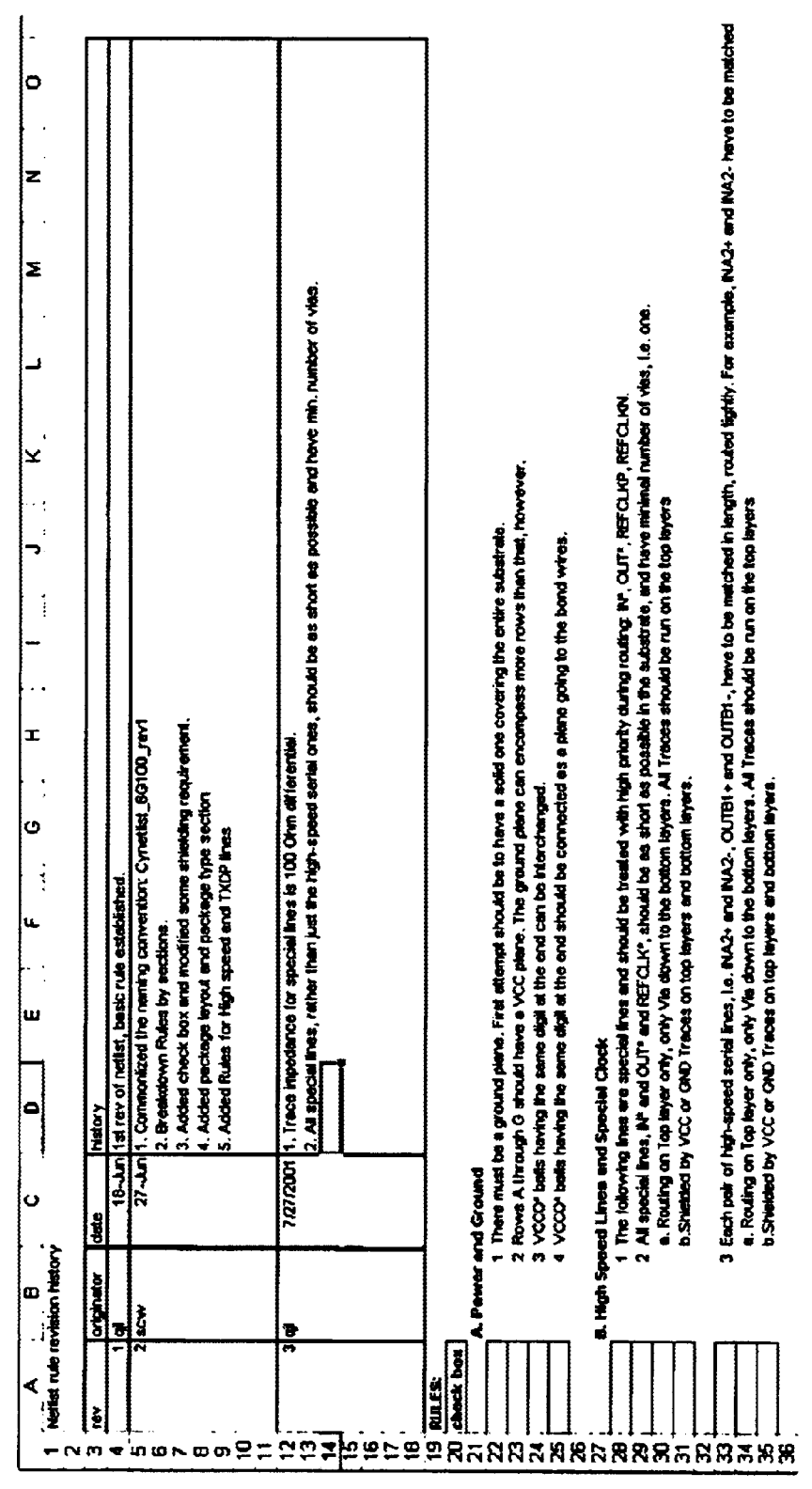

Referring to FIG. 21, an example of substrate routing rules checklist in accordance with a preferred embodiment of the present invention is shown. The step of creating substrate routing rules (e.g., the block 110 of FIG. 1) generally comprises the creation of rules for a substrate designer to follow in routing the substrate. The routing rules may be in checklist form so that the designer may check off each item as the item is confirmed to be compliant. Revision history for the rules is generally documented. The rules may cover requirements for shielding, connection interchangeability, etc.

Figure 22:
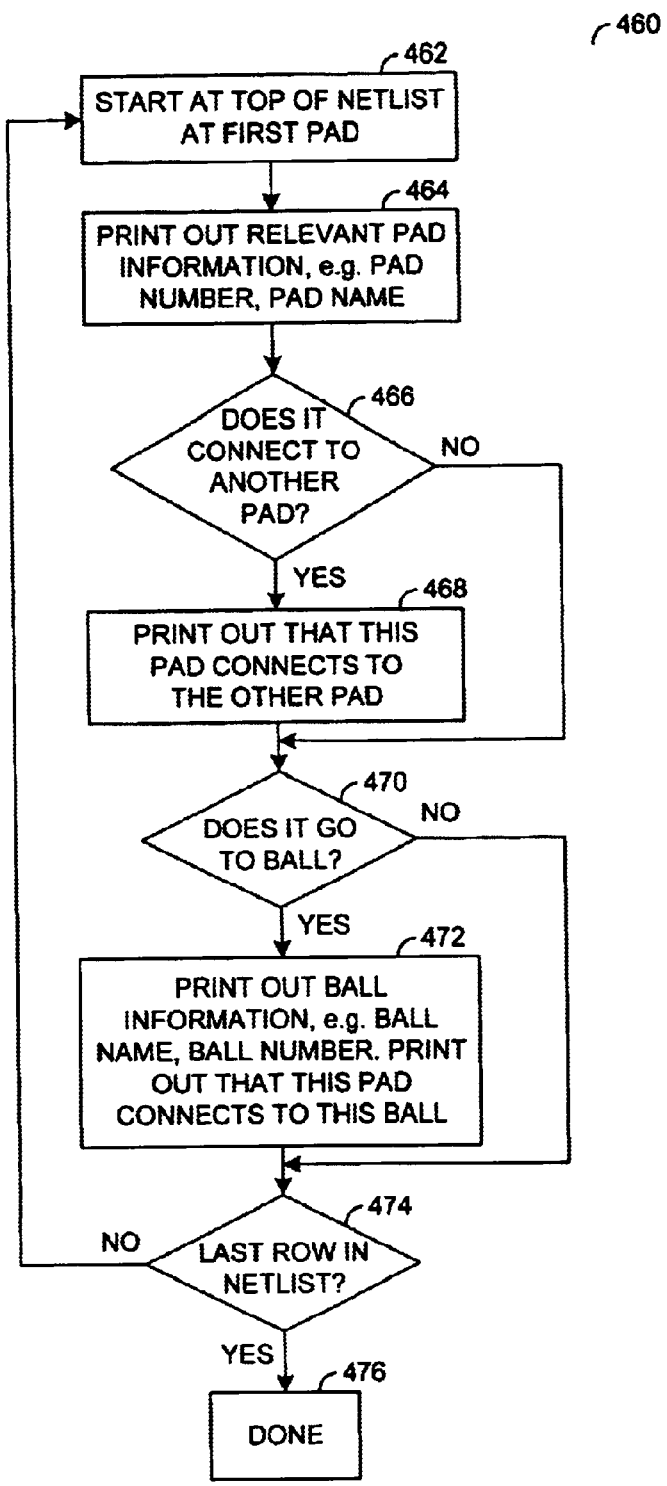
FIG. 22 is a flow diagram illustrating a software pins file generating process in accordance with a preferred embodiment of the present invention.

Referring to FIG. 22, a flow diagram 460 is shown further detailing the step 112 of FIG. 1. The process of generating a software pins file may begin by selecting the first pad of the netlist (e.g., the block 462). Relevant pad information (e.g., pad number, pad name, etc.) may be entered into the software pins file (e.g., the block 464). The selected pad may be checked to determine whether the pad is connected to another pad. When the selected pad connects to another pad, an indication of the connection between the two pads may be entered into the software pins file (e.g., the block 468).

When the connection has been entered or the pad is not connected to another pad, a check may be, performed to determine whether the pad goes to a ball (e.g., the block 470). When the pad goes to a ball, the ball information (e.g., ball name, ball number, etc.) may be entered into the software pins file along with an indication of the pad to ball connection (e.g., the block 472).

When the ball information has been entered or the pad does not go to a ball, the process may continue with the next row in the netlist and repeat the checks (e.g., the block 474). When all the rows in the netlist have been checked, the process generally terminates (e.g., the block 476).

Referring to FIGS. 23(*a–b*), example formats of a software pins file are shown. When the process 100 is completed, the package may be delivered to all interested parties (e.g., the block 114 of FIG. 1).

The functions performed by the flow diagrams of FIGS. 1–2, 5–9, 11–15, 17–19, and 22 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to any type of disk including floppy disk, optical disk, CD-ROM, and magneto-optical disks, ROMS, RAMS, EPROMs, EEPROMs, Flash memory, magnetic or optical cards, or any type of media suitable for storing electronic instructions.

The present invention may reduce human intervention in pinout generation processes, thereby reducing the chance of human error. The present invention may automate mundane tasks of hand reformatting information for different purposes. The present invention may provide different angles for generating ball assignments that may comprise visual views (e.g., a name and a pad number) of the grid. The views may be used to fine tune assignments. Furthermore, the views may be automatically generated.

The present invention may allow changing information in the pinout process with little more than re-running the scripts. The present invention may provide a time savings compared to conventional hand re-creation of the tables.

while the invention has been particularly shown and described with reference to the preferred embodiments thereof, it will be understood by those skilled in the art that various changes in form and details may be made without departing from the spirit and scope of the invention.

What is claimed is:

1. A method for creating pinouts for inter-die connections comprising the steps of:

entering information about pads and balls of said inter-die connections into a computer readable file;

marking portions of said computer readable file, wherein said marking indicates a correlation between pads and balls; and generating ball names according to one or more sets of computer executable instructions in said computer readable file in response to (i) interim ball names and (ii) a pre-defined mapping scheme for assigning a ball name.

2. The method according to claim 1, further comprising the steps of:

determining a correctness of said marking according to said one or more sets of computer executable instructions;

generating a unique netname for each bonded pad according to said one or more sets of computer executable instructions.

3. The method according to claim 2, wherein said one or more sets of computer executable instructions are configured to provide warning of potential errors.

4. The method according to claim 2, further comprising the steps of:

generating a list of balls for an entire device according to said one or more sets of computer executable instructions;

creating a set of bordered cells representing a ball grid of said device in said computer readable file;

checking for errors in said ball grid according to said one or more sets of computer executable instructions; and checking said ball grid for a rotational short.

5. The method according to claim 4, wherein the step of checking said ball grid for a rotational short comprises the steps of:

generating a rotation map of said ball grid according to said one or more sets of computer executable instructions; and checking said rotation map and said ball grid for a rotational short according to said one or more sets of computer executable instructions.

6. The method according to claim 5, further comprising the steps of:

clearing said ball names; and annotating one or more ball assignments according to said one or more sets of computer executable instructions.

7. The method according to claim 6, further comprising the step of:

fine tuning said ball names and said ball grid according to predetermined criteria.

8. The method according to claim 7, wherein the step of fine tuning comprises the steps of:

generating said ball grid from said ball names according to said one or more sets of computer executable instructions;

reordering pad locations according to said predetermined criteria;

annotating said ball names with pad-to-ball connections in a pad grid according to said one or more sets of computer executable instructions; and generating said pad grid based on ball names according to said one or more sets of computer executable instructions.

9. The method according to claim 7, further comprising the step of:

generating one or more substrate routing rules; and generating a software pins file.

10. The method according to claim 9, wherein the step of generating said software pins file comprises the steps of:

extracting information from said ball names; and generating a table in a predetermined format according to said one or more sets of computer executable instructions.

11. The method according to claim 1, wherein at least one of said one or more sets of computer executable instructions is configured to examine said interim ball names and produce said names in response to a programmed name change.

12. The method according to claim 1, further comprising the step of:

generating a ball grid according to said one or more sets of computer executable instructions.

13. The apparatus according to claim 1, wherein said computer readable file comprises:

a number of columns comprising said information about said pads and said balls of said inter-die connections;

a column comprising said all names; and a column comprising said interim ball names.

14. A computer readable medium containing one or more sets of computer executable instructions for performing the steps of:

(a) creating a netlist; and (b) creating a ball grid, wherein the step of creating said netlist comprises generating ball names in response to (i) interim ball names and (ii) a pre-defined mapping scheme for assigning a ball name.

15. The computer readable medium according to claim 14, wherein said netlist comprises inter-die connections of a multi chip module (MCM) device.

16. The computer readable medium according to claim 14, wherein said one or more sets of computer executable instructions further comprises computer executable instructions for performing the steps of:

annotating said netlist;

fine tuning said netlist and said ball grid; and generating a software pins file.

17. The computer readable medium according to claim 16, wherein said one or more sets of computer executable instructions further comprises computer executable instructions for performing the steps of:

checking said netlist for errors; and checking said ball grid for errors.

18. An apparatus configured to execute one or more sets of computer executable instructions for performing the steps of:

(a) creating a netlist; and (b) creating a ball grid, wherein the step of creating said netlist comprises generating ball names in response to (i) interim ball names and (ii) a Pre-defined mapping scheme for assigning a ball name.

19. The apparatus according to claim 18, wherein said netlist comprises inter-die connections of a multi chip module (MCM) device.

20. The apparatus according to claim 18, further configured to execute one or more sets of computer executable instructions for performing the steps of:

annotating said netlist;

fine tuning said netlist and said ball grid; and generating a software pins file.

21. The apparatus according to claim 20, further configured to execute one or more sets of computer executable instructions for performing the steps of:

checking said netlist for errors; and checking said ball grid for errors.

* * * * *